US 12,532,618 B2

(12) United States Patent
Gao et al.

(10) Patent No.: US 12,532,618 B2
(45) Date of Patent: Jan. 20, 2026

(54) DISPLAY SUBSTRATE, METHOD FOR MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yingchang Gao, Beijing (CN); Tinghua Shang, Beijing (CN); Wei Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 614 days.

(21) Appl. No.: 17/905,819

(22) PCT Filed: Oct. 22, 2021

(86) PCT No.: PCT/CN2021/125807
§ 371 (c)(1),
(2) Date: Sep. 7, 2022

(87) PCT Pub. No.: WO2022/111171
PCT Pub. Date: Jun. 2, 2022

(65) Prior Publication Data
US 2023/0157113 A1 May 18, 2023

(30) Foreign Application Priority Data
Nov. 30, 2020 (CN) .......................... 202011373102.X

(51) Int. Cl.
H10K 59/131 (2023.01)
H10K 59/12 (2023.01)
H10K 59/80 (2023.01)

(52) U.S. Cl.
CPC ....... *H10K 59/131* (2023.02); *H10K 59/1201* (2023.02); *H10K 59/1315* (2023.02); *H10K 59/8791* (2023.02)

(58) Field of Classification Search
CPC ............ H10K 59/131; H10K 59/1201; H10K 59/8791; H10K 59/1315
(Continued)

(56) References Cited

U.S. PATENT DOCUMENTS

2007/0291042 A1    12/2007  Kwak et al.
2013/0093658 A1*   4/2013   Park .................. G02F 1/136213
                                                     345/92

(Continued)

FOREIGN PATENT DOCUMENTS

CN    101093303 A    12/2007
CN    106298851 A    1/2017
(Continued)

OTHER PUBLICATIONS

ISA China National Intellectual Property Administration, International Search Report and Written Opinion Issued in Application No. PCT/CN2021/125807, Jan. 26, 2022, WIPO, 14 pages. (Submitted with Partial Translation).

(Continued)

*Primary Examiner* — Dzung Tran
(74) *Attorney, Agent, or Firm* — McCoy Russell LLP

(57) ABSTRACT

The present disclosure provides a display substrate, a manufacturing method and a display device. The display substrate includes a pixel region, a plurality of subpixels, a plurality of first power source lines and a fanout region. An angle (Continued)

between a second direction and a first direction is 80° to 100°, at least a portion of the first power source line extends in the first direction, the pixel region is provided with a first side and a second side arranged in the first direction, and the fanout region is arranged at the first side.

20 Claims, 14 Drawing Sheets

(58) Field of Classification Search
USPC .......................................................... 257/72
See application file for complete search history.

(56) References Cited

U.S. PATENT DOCUMENTS

| | | | | |
|---|---|---|---|---|
| 2014/0167009 | A1* | 6/2014 | Lee | H01L 23/5225 257/40 |
| 2014/0320385 | A1* | 10/2014 | Kwon | H10K 59/1315 345/82 |
| 2016/0260781 | A1* | 9/2016 | Yang | G09G 3/3233 |
| 2017/0269762 | A1* | 9/2017 | Xu | G06F 3/0412 |
| 2017/0345877 | A1* | 11/2017 | Hwang | H10K 59/131 |
| 2017/0365647 | A1* | 12/2017 | Choi | H10K 59/00 |
| 2018/0366052 | A1 | 12/2018 | Shi | |
| 2020/0058241 | A1 | 2/2020 | Moon et al. | |
| 2020/0233463 | A1 | 7/2020 | Chen | |
| 2021/0159284 | A1 | 5/2021 | Huang et al. | |
| 2021/0408203 | A1 | 12/2021 | Shi et al. | |

FOREIGN PATENT DOCUMENTS

| | | |
|---|---|---|
| CN | 107452773 A | 12/2017 |
| CN | 109102781 A | 12/2018 |
| CN | 110114885 A | 8/2019 |
| CN | 110867525 A | 3/2020 |
| CN | 110910766 A | 3/2020 |
| CN | 213212167 U | 5/2021 |
| RU | 2721754 C1 | 5/2020 |
| RU | 2727938 C1 | 7/2020 |

OTHER PUBLICATIONS

State Intellectual Property Office of the People's Republic of China, Office Action and Search Report Issued in Application No. 202011373102.X, Dec. 9, 2024, 31 pages. (Submitted with Partial English Translation).

* cited by examiner

DISPLAY SUBSTRATE, METHOD FOR MANUFACTURING THE SAME AND DISPLAY DEVICE

CROSS-REFERENCE TO RELATED APPLICATIONS

The present application is a U.S. National Phase of International Application No. PCT/CN2021/125807, entitled "DISPLAY SUBSTRATE AND MANUFACTURING METHOD THEREFOR, AND DISPLAY APPARATUS," and filed on Oct. 22, 2021. International Application No. PCT/CN2021/125807 claims priority to Chinese Patent application No. 202011373102.X, filed on Nov. 30, 2020. The entire contents of each of the above-listed applications are hereby incorporated by reference for all purposes.

TECHNICAL FIELD

The present disclosure relates to the field of display technology, in particular to a display substrate, a method for manufacturing the same, and a display device.

BACKGROUND

Currently, it has been a trend to provide a mobile phone with a large screen. However, along with an increase in a size of the scree, a length of a signal line in the screen increases too. The longer the signal line, the larger the IR drop generated on the signal line when an image is displayed, and the more serious the voltage loading on the signal line. At this time, different brightness values occur at different regions of the screen, i.e., the brightness uniformity of the screen is deteriorated.

SUMMARY

An object of the present disclosure is to provide a display substrate, a manufacturing method thereof and a display device, so as to solve the above-mentioned problems.

In order to achieve the above object, the present disclosure provides the following technical solutions.

In one aspect, the present disclosure provides in some embodiments a display substrate, including: a pixel region and a peripheral region arranged at a periphery of the pixel region; a plurality of first power source lines, at least a portion of each first power source line being arranged at the pixel region and extending in a first direction; a fanout region arranged at the peripheral region, the pixel region being provided with a first side and a second side arranged in the first direction, the fanout region being arranged at the first side; and a plurality of subpixels arranged at the pixel region and including at least one pair of subpixels in a first color and a plurality of sub-pixels in the other colors. Each pair of subpixels in the first color include a first pixel block and a second pixel block arranged in a second direction and both emitting light in the first color, a minimum distance between the first pixel block and the second pixel block in each pair of subpixels in the first color is smaller than or equal to a minimum distance between two subpixels in a same color in the plurality of subpixels in the other colors, and an angle between the second direction and the first direction is 80° to 100°.

In a possible embodiment of the present disclosure, a length of the pixel region in the first direction is smaller than a length of the pixel region in the second direction. The display substrate further includes: a plurality of gate lines, at least a portion of each gate line being arranged at the pixel region and extending in the second direction; and a plurality of data lines, at least a portion of each data line being arranged at the pixel region and extending in the first direction.

In a possible embodiment of the present disclosure, a length of the first power source line in the first direction is smaller than a length of the gate line in the second direction.

In a possible embodiment of the present disclosure, a length D1 of the first power source line in the first direction satisfies 20% L2≤l≤90% L2, where L2 represents a length of the display substrate in the second direction.

In a possible embodiment of the present disclosure, the display substrate further includes a gate driving circuit, the pixel region is provided with a third side and a fourth side arranged in the second direction, and the gate driving circuit is arranged at the third side and/or the fourth side.

In a possible embodiment of the present disclosure, the display substrate further includes a first power source pattern arranged at the peripheral region and including a first sub-pattern, the first sub-pattern includes a first straight edge portion and an arc-like first corner portion coupled to the first straight edge portion, the first straight edge portion extends in the second direction and is coupled to the plurality of first power source lines, and an angle a between an extension direction of a radius of curvature of the first corner portion and the second direction satisfies 0°≤a≤90°.

In a possible embodiment of the present disclosure, the peripheral region includes a bending region. The first power source pattern further includes: a second sub-pattern, at least a portion of the second sub-pattern extending in the second direction, the second sub-pattern being arranged at a second side of the bending region, the first sub-pattern being arranged at a first side of the bending region, the first side and the second side being arranged in the first direction; and a plurality of conductive connection members arranged in the second direction and each extending in the first direction, at least a portion of each conductive connection member being arranged at the bending region, and each conductive connection member being coupled to the first sub-pattern and the second sub-pattern.

In a possible embodiment of the present disclosure, the display substrate further includes: a cathode, at least a portion of the cathode being arranged at the pixel region; and a second power source pattern arranged at the peripheral region and coupled to the cathode. The second power source pattern includes a second straight edge portion and a second corner portion coupled to the second straight edge portion, the second straight edge portion extends in the second direction, and an angle a between an extension direction of a radius of curvature of the second corner portion and the second direction satisfies 0°≤a≤90°.

In a possible embodiment of the present disclosure, an orthogonal projection of the first power source pattern onto a base substrate of the display substrate is located between an orthogonal projection of the pixel region onto the base substrate and an orthogonal portion of a portion of the second power source pattern onto the base substrate.

In a possible embodiment of the present disclosure, the display substrate further includes a first transfer pattern, an orthogonal projection of the first transfer pattern onto a base substrate of the display substrate overlaps an orthogonal projection of the second power source pattern onto the base substrate at a first overlapping region and overlaps an orthogonal projection of the cathode onto the base substrate at a second overlapping region, and the first transfer pattern is coupled to the second power source pattern through a via hole in the first overlapping region and coupled to the cathode through a via hole in the second overlapping region.

In a possible embodiment of the present disclosure, the first transfer pattern surrounds the pixel region.

In a possible embodiment of the present disclosure, each subpixel includes a light-emitting element and a pixel driving circuit, the light-emitting element includes a cathode, a light-emitting layer and an anode laminated one on another, the anode is arranged between the light-emitting layer and a base substrate of the display substrate, the pixel driving circuit includes a driving transistor, a threshold compensation transistor and a first connection member arranged between the anode and the base substrate, the first connection member extends in the first direction, a first electrode of the threshold compensation transistor is electrically coupled to a first electrode of the driving transistor, and a second electrode of the threshold compensation transistor is electrically coupled to a gate electrode of the driving transistor through the first connection member. The first pixel block includes a first active light-emitting region, and the second pixel block includes a second active light-emitting region. In the first pixel block, a minimum distance between an orthogonal projection of the first connection member onto a straight line extending in the second direction and an orthogonal projection of the first active light-emitting region onto the straight line is a first distance, or the orthogonal projection of the first connection member onto the straight line extending in the second direction overlaps the orthogonal projection of the first active light-emitting region onto the straight line. In the second pixel block, a minimum distance between the orthogonal projection of the first connection member onto the straight line and an orthogonal projection of the second active light-emitting region onto the straight line is a second distance, and the first distance is smaller than the second distance. In the first pixel block, an overlapping area between an orthogonal projection of the anode onto the base substrate and the orthogonal projection of the first connection member onto the base substrate is a first overlapping area, in the second pixel block, an overlapping area between the orthogonal projection of the anode onto the base substrate and the orthogonal projection of the first connection member onto the base substrate is a second overlapping area, and a ratio of the first overlapping area to the second overlapping area is 0.8 to 1.2.

In a possible embodiment of the present disclosure, each subpixel includes a light-emitting element and a pixel driving circuit for driving the light-emitting element, the light-emitting element includes a cathode, a light-emitting layer and an anode laminated one on another in a direction close to a base substrate of the display substrate, and the anode includes a body electrode and a connection electrode. The plurality of subpixels includes a plurality of subpixels in a third color and a plurality of subpixels in a second color, each subpixel in the third color includes a third active light-emitting region, the body electrode of the subpixel in the third color has a same shape as the third active light-emitting region, an orthogonal projection of the third active light-emitting region onto the base substrate is located within an orthogonal projection of the body electrode onto the base substrate, each subpixel in the second color includes a fourth active light-emitting region, the body electrode of the subpixel in the second color has a same shape as the fourth active light-emitting region, and an orthogonal projection of the fourth active light-emitting region onto the base substrate is located within an orthogonal projection of the body electrode onto the base substrate. The plurality of data lines is arranged at a side of the anode facing the base substrate, and the body electrode of at least one of the subpixel in the third color and the subpixel in the second color overlaps at least two data lines. The display substrate further includes: a planarization layer arranged between a film layer where the plurality of data lines is located and a film layer where the anode is located; and an interlayer insulation layer arranged between the film layer where the plurality of data lines is located and the base substrate of the display substrate. Each subpixel includes a second connection member arranged at a same layer as the data line. In the subpixel in the third color, the connection electrode is electrically coupled to the second connection member through a first via hole penetrating through the planarization layer, and the second connection member is electrically coupled to the pixel driving circuit through a first connection hole penetrating through the interlayer insulation layer. In a direction perpendicular to the base substrate, the first via-hole and the first connection hole do not overlap the body electrode, and an orthogonal projection of the first via hole onto a first straight line extending in the first direction overlaps an orthogonal projection of the first connection hole onto the first straight line.

In a possible embodiment of the present disclosure, each subpixel includes a light-emitting element, the light-emitting element includes a cathode, a light-emitting layer and an anode laminated one on another, the cathode is arranged at a side of the anode away from a base substrate of the display substrate, the plurality of subpixels includes a plurality of subpixels in a second color, each subpixel in the second color includes a fourth active light-emitting region, the plurality of data lines is arranged at a side of the anode facing the base substrate of the display substrate, and each subpixel further includes a second connection member arranged at a same layer as the plurality of data lines and coupled to the anode. In a direction perpendicular to the base substrate, the anode of each subpixel in the second color overlaps the data line, the first power source line and the second connection member, and in portions of the data line, the first power source line and the second connection member overlapping the anode, the first power source line and the data line are arranged at two sides of the second connection member respectively. The second connection member includes a first connection sub-member and a second connection sub-member coupled to the first connection sub-member and arranged at a side of the first connection sub-member adjacent to the first power source line, and the first connection sub-member and the second connection sub-member overlap the anode. In the first direction, a size of the first connection sub-member is greater than a size of the second connection sub-member, and a ratio of a minimum distance between adjacent edges of the first connection sub-member and the data line to a minimum distance between adjacent edges of the second connection sub-member and the first power source line is 0.4 to 2.2.

In another aspect, the present disclosure provides in some embodiments a display device including the above-mentioned display substrate.

In yet another aspect, the present disclosure provides in some embodiments a method for manufacturing a display substrate. The display substrate includes a pixel region and a peripheral region arranged at a periphery of the pixel region, and a length of the pixel region in a first direction is smaller than a length of the pixel region in a second direction. The method includes: forming a plurality of first power source lines, at least a portion of each first power source line being arranged at the pixel region and extending in the first direction; forming a fanout region at the peripheral region, the pixel region being provided with a first side and a second side arranged in the first direction, the fanout region being arranged at the first side; forming a plurality of subpixels at the pixel region, the plurality of subpixels including at least one pair of subpixels in a first color and a plurality of sub-pixels in the other colors. Each pair of subpixels in the first color include a first pixel block and a second pixel block arranged in the second direction and both emitting light in the first color, a minimum distance between the first pixel block and the second pixel block in each pair of subpixels in the first color is smaller than or equal to a minimum distance between two subpixels in a same color in the plurality of subpixels in the other colors, and an angle between the second direction and the first direction is 80° to 100°.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

FIG. 21 is an enlarged view of C5 in FIG. 8a.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
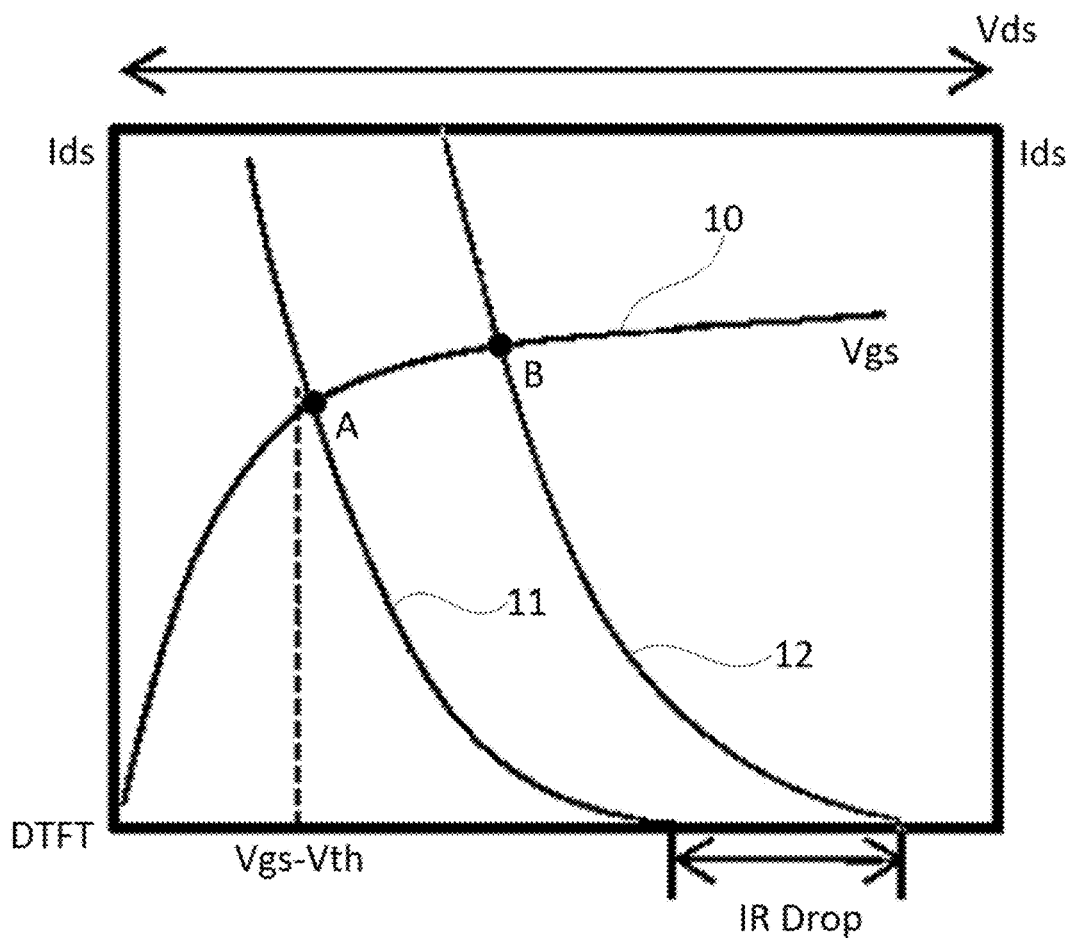
FIG. 1 is a schematic view showing an output characteristic curve of a transistor and a current-voltage operating curve of an OLED.

FIG. 1 shows an output characteristic curve (e.g., 10) of a driving transistor DTFT in a subpixel driving circuit and a current-voltage operating curve (e.g., 11 and 12) of an Organic Light-Emitting Diode (OLED). The OLED is driven by a current to emit light. An intersection between the current-voltage operating curve and the output characteristic curve just indicates an operating current applied to two ends of the OLED. As shown in FIG. 1, when a voltage Vds applied to the two ends of the OLED is relatively large, an intersection C between the two curves is located at a saturation region, i.e., the operating current of the OLED is stable. However, the current-voltage curve of the OLED moves to the left along with a decrease in Vds, and when Vds is reduced to a certain value, the intersection between the two curves moves from the saturation region of the DTFT characteristic curve to a linear region (e.g., an intersection A). At this time, the operating current of the OLED is instable, and brightness non-uniformity occurs for a screen.

It should be appreciated that, in FIG. 1, Vth represents a threshold voltage of the driving transistor DTFT, Vgs represents a difference between a voltage applied to a gate electrode and a voltage applied to a source electrode of the driving transistor DTFT, and Ids represents a driving current for the OLED. In FIG. 1, a region on the left of a dotted line is the linear region, while a region on the right is the saturation region.

In a display product, a power source line has a certain resistance, so an IR drop occurs when a power source signal is transmitted through the power source line. When the IR drop is relatively large, the voltage Vds at the two ends of the OLED decreases, and the current-voltage operating curve of the OLED easily moves from the saturation region to the linear region. However, along with an increase in a distance between a subpixel and a driving Integrated Circuit (IC), the IR drop across the power source line increases, and correspondingly, the driving current at the linear region decreases. Hence, the brightness of the screen decreases along with the increase in the distance between the subpixel and the driving IC, and the brightness uniformity of the screen is deteriorated. In addition, due to different characteristics of a red subpixel, a green subpixel and a blue subpixel, color non-uniformity occurs for the screen in the case of a serious IR drop.

Figure 2:
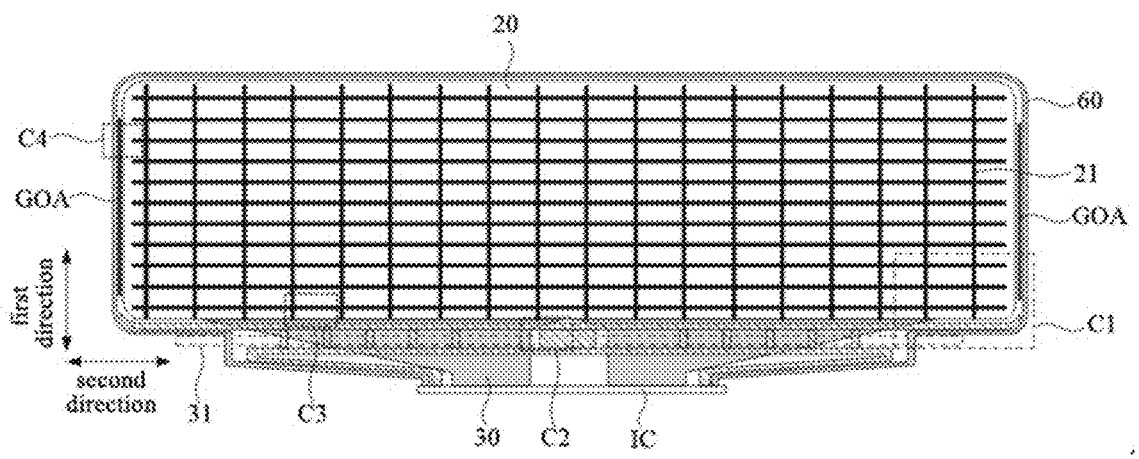
FIG. 2 is a schematic view showing a display substrate according to one embodiment of the present disclosure.
Figure 3:
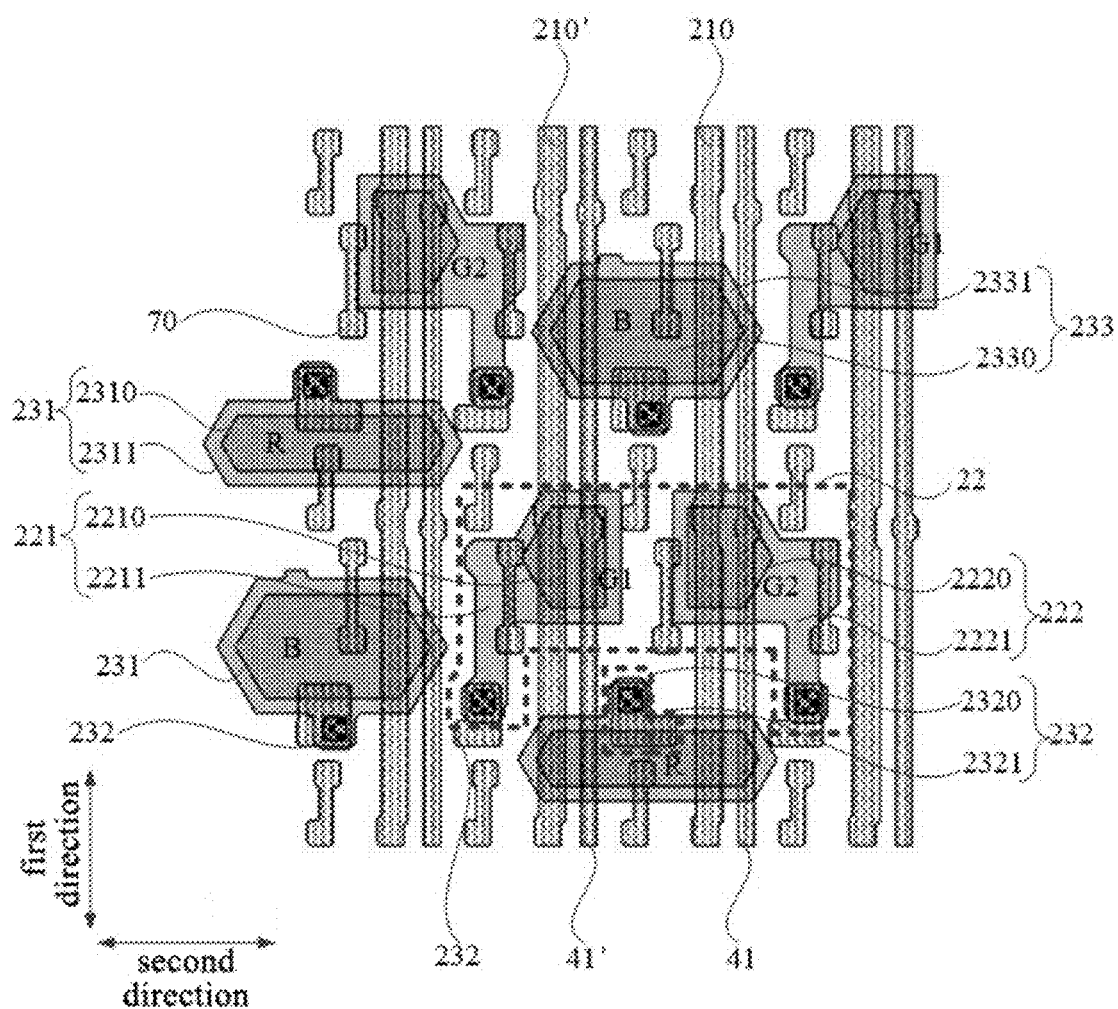
FIG. 3 is a schematic view showing pixel blocks, data sub-lines and first power source sub-lines according to one embodiment of the present disclosure.
Figure 4:
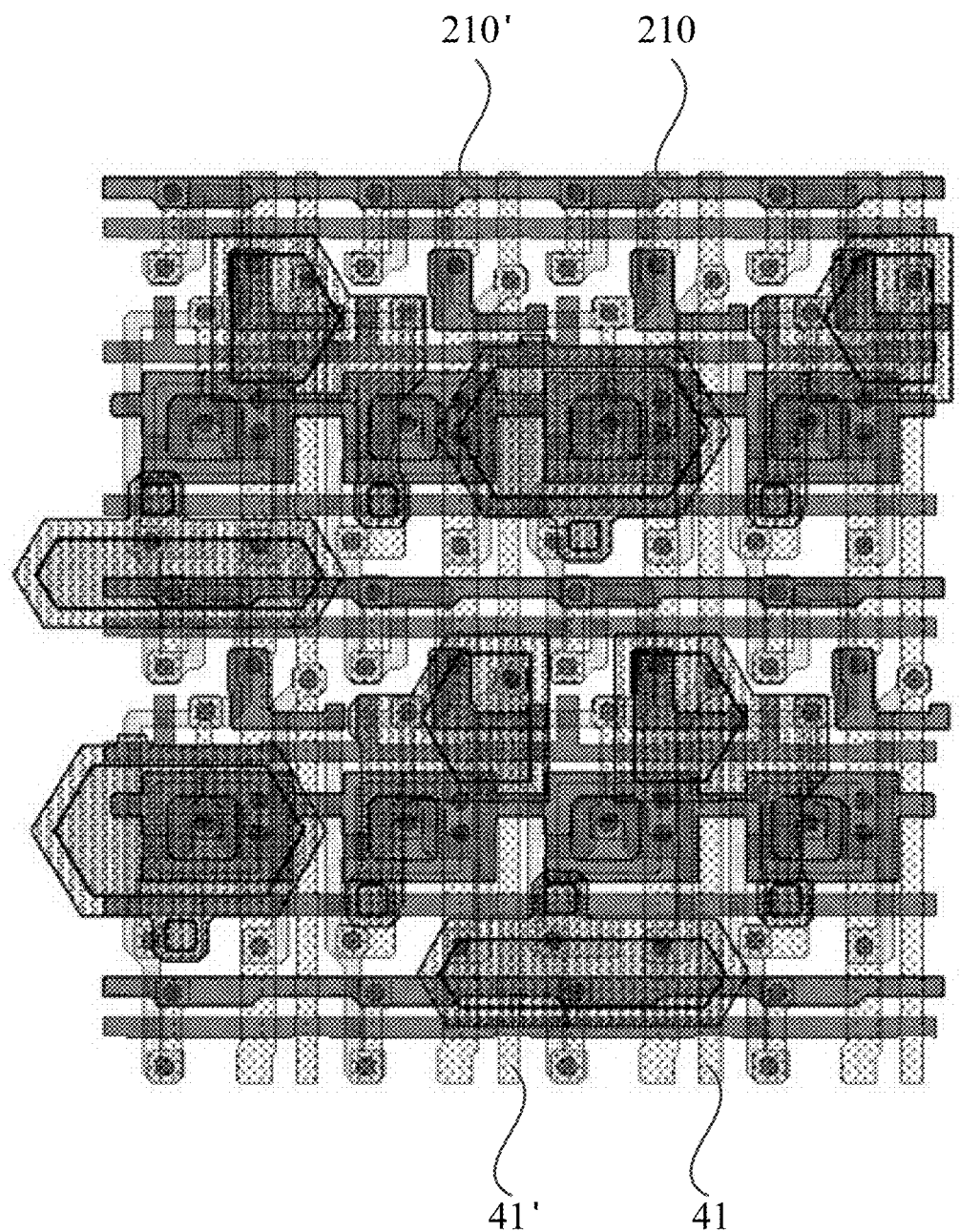
FIG. 4 is a schematic view showing a subpixel according to one embodiment of the present disclosure.

As shown in FIGS. 2 to 4, the present disclosure provides in some embodiments a display substrate, which includes a pixel region 20 and a peripheral region arranged at a periphery of the pixel region 20. An angle between a second direction and a first direction is 80° to 100°. The display substrate further includes: a plurality of first power source lines 21, at least a portion of each first power source line 21 being arranged at the pixel region 20 and extending in the first direction; a fanout region 30 arranged at the peripheral region, the pixel region being provided with a first side and a second side arranged in the first direction, the fanout region 30 being arranged at the first side; and a plurality of subpixels arranged at the pixel region 20 and including at least one pair of subpixels 22 in a first color and a plurality of sub-pixels in the other colors. Each pair of subpixels 22 include a first pixel block 221 and a second pixel block 222 arranged in the second direction and both emitting light in the first color, a minimum distance between the first pixel block 221 and the second pixel block 222 in each pair of subpixels 22 in the first color is smaller than or equal to a minimum distance between two subpixels in a same color in the plurality of subpixels in the other colors.

For example, the pixel region 20 includes a display region, a plurality of subpixels having a display function is arranged at the pixel region 20, and a plurality of dummy pixels not having the display function surrounds the plurality of subpixels.

In a possible embodiment of the present disclosure, the peripheral region surrounds the pixel region 20.

For example, the first direction is a horizontal direction, and the second direction is a vertical direction.

For example, the angle between the second direction and the first direction is 80° to 100°, with endpoints inclusive.

For example, the plurality of first power source lines 21 is arranged in the second direction, and at least a portion of each first power source line 21 extends in the first direction. The first power source line 21 is configured to transmit a positive power source signal Vdd. The first power source line 21 includes a portion arranged at the pixel region 20 and a portion arranged at the peripheral region.

For example, a power source compensation pattern is arranged at the pixel region 20, and at least a portion of the power source compensation pattern extends in the second direction. The power source compensation pattern is electrically coupled to the plurality of first power source lines 21, so as to form a net-like power source structure at the pixel region 20. For example, the power source compensation pattern is arranged at a layer different from the first power source line 21.

Figure 17:
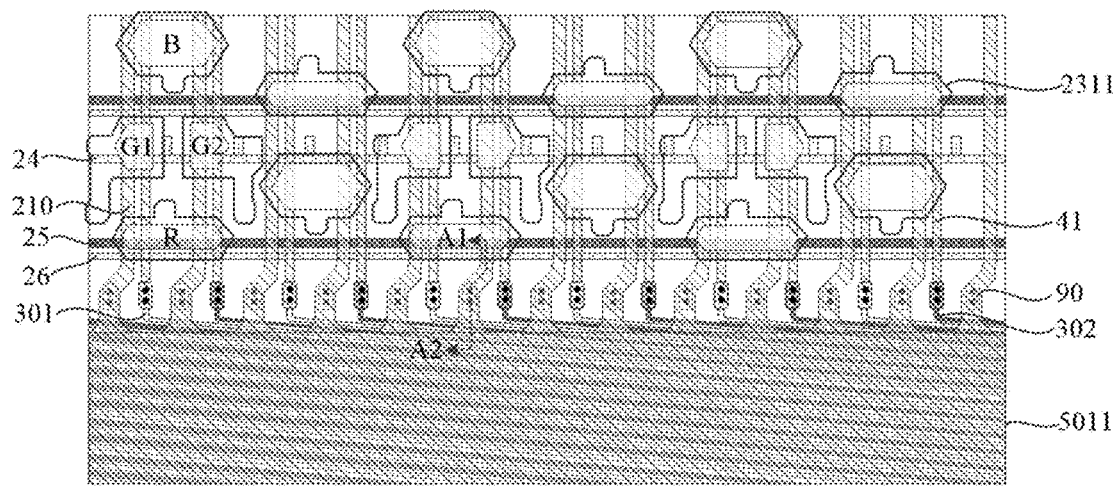
FIG. 17 is an enlarged view of C3 in FIG. 2.

As shown in FIGS. 2 and 17, the display substrate further includes the fanout region 30 arranged at the peripheral region. The fanout region 30 is arranged at a side of the pixel region 20 in the first direction, i.e., at a side of the pixel region 20 where a long edge is located. A plurality of fanout lines is arranged at the fanout region 30, one end of each of at least a part of fanout lines is coupled to the data line 41, and the other end is coupled to a driving IC in the display substrate. For example, the plurality of fanout lines is arranged at a same layer and made of a same material. Alternatively, a part of the plurality of fanout lines are arranged at a same layer and made of a same material, the other part of the plurality of fanout lines are arranged at a same layer and made of a same material, and the two parts of fanout lines are arranged at different layers.

As shown in FIGS. 2 and 17, more specifically, the plurality of fanout lines includes a plurality of first fanout lines 301 and a plurality of second fanout lines 302. The plurality of first fanout lines 301 corresponds to a part of data lines of the display substrate respectively, and each first fanout line is coupled to a corresponding data line and a corresponding pin of the driving IC. The plurality of second fanout lines 302 corresponds to the other part of data lines of the display substrate respectively, and each second fanout line is coupled to a corresponding data line and a corresponding pin of the driving IC.

For example, the plurality of first fanout lines 301 is arranged at a same layer, and made of a same material, as a gate line 24 and a resetting signal line 26 of the display substrate, and the plurality of second fanout lines 302 is arranged at a same layer, and made of a same material, as an initial signal line 25 of the display substrate.

The display substrate further includes the driving IC, and the fanout region 30 is arranged between the driving IC and the pixel region 20.

Figure 18:
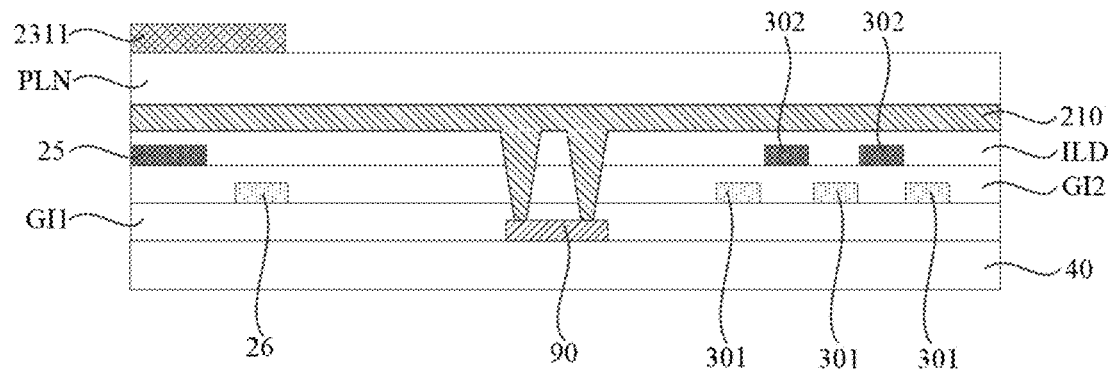
FIG. 18 is a sectional view of C3 along line A1-A2 in FIG. 17.

It should be appreciated that, FIG. 18 is a sectional view of the display substrate along line A1-A2 in FIG. 17. As shown in FIG. 18, the display substrate includes a base substrate 40, an active pattern 90, an anode 2311, a first gate insulation layer GI1, a second gate insulation layer GI2, an interlayer insulation layer ILD and a planarization layer PLN. The first power source sub-line 210 is coupled to the active pattern 90 through a via hole, so as to ensure that the structures right below and surrounding the first power source sub-line 210 are etched evenly.

For example, the first pixel block 221 includes a first anode 2211, and the second pixel block 222 includes a second anode 2221.

For example, the first pixel block 221 includes a first organic light-emitting pattern 2210, the second pixel block 222 includes a second organic light-emitting pattern 2220, and the first organic light-emitting pattern 2210 and the second organic light-emitting pattern 2220 are each made of an organic light-emitting material.

For example, the first pixel block 221 and the second pixel block 222 of the pair of subpixels 22 in the first color are green pixel blocks, e.g., G1 and G2.

For example, the first pixel block 221 and the second pixel block 222 are each of a pentagonal shape, and arranged symmetrically.

For example, the minimum distance between the first pixel block and the second pixel block is 5 μm to 20 μm, with endpoints inclusive.

For example, the subpixels in the other colors include red subpixels R and blue subpixels B.

For example, the minimum distance between the subpixels in a same color in the plurality of subpixels in the other colors is a minimum distance between anodes of two red subpixels, or a minimum distance between anodes of two blue subpixels. For example, the minimum distance is 5 μm to 20 μm, with endpoints inclusive.

For example, the minimum distance between the subpixels in a same color in the plurality of subpixels in the other colors is a minimum distance between organic light-emitting patterns of two red subpixels, or a minimum distance between organic light-emitting patterns of two blue subpixels. For example, the minimum distance is 5 μm to 20 μm, with endpoints inclusive.

Figure 5:
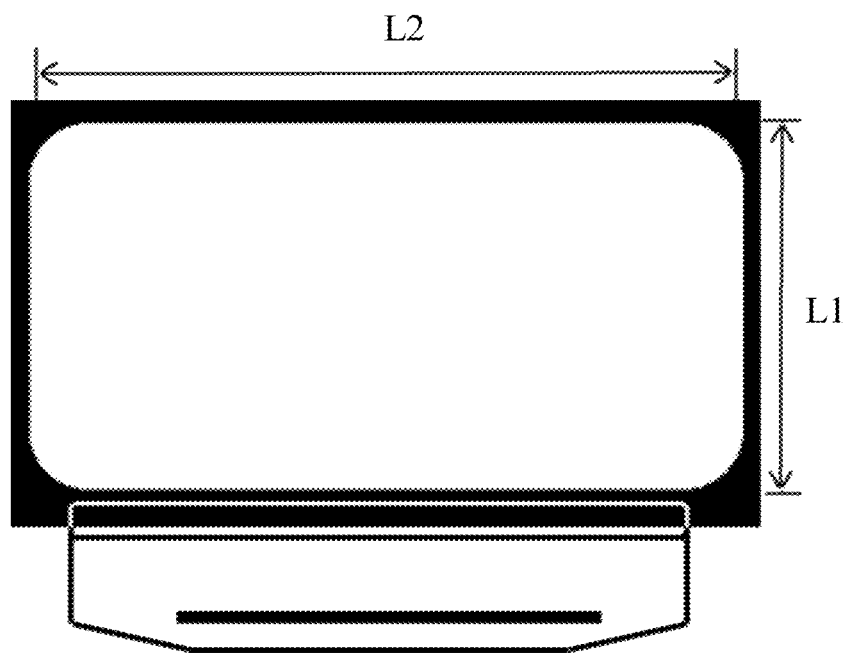
FIG. 5 is a schematic view showing a basic structure of the display substrate according to one embodiment of the present disclosure.

Based on the above-mentioned specific structure of the display substrate, the length of the pixel region 20 in the first direction is smaller than the length thereof in the second direction, at least a portion of the first power source line 21 extends in the first direction, and the fanout region 30 is arranged at a side of the pixel region 20 in the first direction, so that the first power source line 21 extends along a short edge of the display substrate and the fanout region 30 is arranged at a side where a long edge of the display substrate is located. Hence, as shown in FIG. 5, in the display substrate according to the embodiments of the present disclosure, a length of the first power source line 21 is changed from being approximate to L2 to being approximate to L1. An IR drop across the first power source line 21 is in direct proportion to its length, and after the length of the first power source line 21 has been reduced, the voltage loading on the first power source line 21 decreases. As a result, it is able to reduce a difference in brightness of the display substrate between a position close to the driving IC and a position away from the driving IC, thereby to improve the brightness uniformity as well as the image quality.

More specifically, a screen for a mobile phone is selected, and an influence of the IR drop across the first power source line 21 on the brightness uniformity of the screen is simulated through changing a Vss–Vss difference applied thereto, where Vdd represents a voltage of a positive power source signal transmitted on the first power source line 21, and Vss represents a voltage of a negative power source signal transmitted on a second power source line (i.e., a negative power source signal line).

Figure 6:
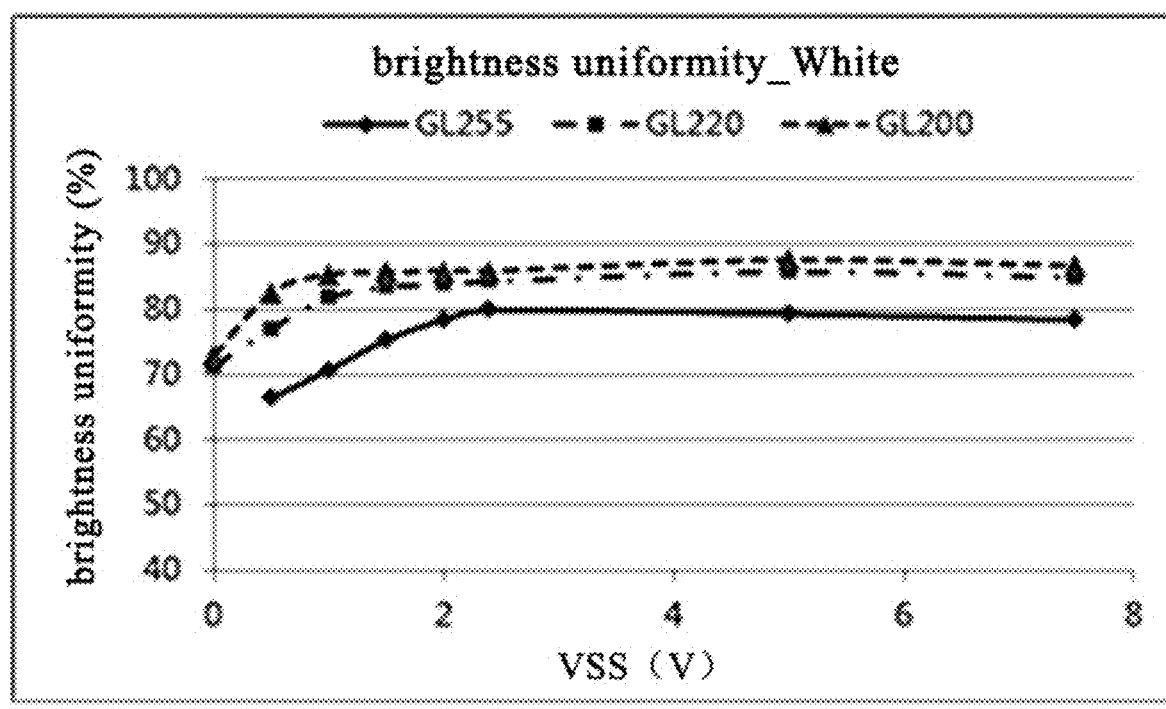
FIG. 6 is a schematic view showing the relationship between brightness uniformity and Vss according to one embodiment of the present disclosure.

To be specific, as shown in FIG. 6 and Table 1, Vdd for the screen is fixed at a specific value, and Vss is adjusted to change a voltage applied to the screen. Next, the brightness uniformity of the screen at different operating voltages is tested. In order to improve the reliability, three gray levels of a white image, i.e., 255, 220 and 220, are selected for the test, and test results are shown in Table 1. Based on the test results, when Vss is small, the brightness uniformity of the screen approximately increases linearly, but when Vss increases to a certain level, the brightness uniformity of the screen becomes stable, i.e., it does not obviously change along with Vss. In addition, the principle and feasibility of the scheme in the embodiments of the present disclosure are further demonstrated through a difference in the brightness uniformity at different gray levels and the fact that the brightness uniformity increases continuously and then becomes stable.

It should be appreciated that, Vdd and Vss are both voltages applied externally. For example, a Vdd–Vss difference is 7V. When there is no IR drop across the first power source line 21, an actual operating voltage applied to the OLED is just 7V. When there is an IR drop across the first power source line 21, e.g., 1V, the actual operating voltage applied to the OLED is 6V.

In the case of a constant Vdd–Vss difference, when the IR drop is smaller, the actual operating voltage at two ends of the OLED is closer to the Vdd–Vss difference, and vice versa. Hence, when there is the IR drop, at a position close to the driving IC, the actual operating voltage at the two ends of the OLED is closer to the Vdd–Vss difference, and at a position away from the driving IC, the actual operating voltage at the two ends of the OLED is smaller than the Vdd–Vss difference.

In actual simulation, there is no IR drop across the first power source line 21 by default, and the actual operating voltage at the two ends of the OLED, i.e., the Vdd–Vss difference, it adjusted through changing Vss. Hence, through adjusting Vss, it is able to reduce the Vdd–Vss difference, i.e., the actual operating voltage at the two ends of the OLED, thereby to simulate the display brightness at the position away from the driving IC when there is the IR drop.

TABLE 1

| | Brightness uniformity (%)_White | | | | | | | |
| --- | --- | --- | --- | --- | --- | --- | --- | --- |
| Vss(V) | 0 | 0.5 | 1 | 1.5 | 2 | 2.4 | 5 | 7.5 |
| GL255 | | 66.4 | 70.7 | 75.3 | 78.4 | 79.9 | 79.3 | 78.4 |
| GL220 | 71.3 | 77 | 81.8 | 83.4 | 83.9 | 84.3 | 85.8 | 84.9 |
| GL200 | 72.9 | 82.6 | 85.4 | 85.7 | 85.9 | 85.9 | 87.6 | 86.7 |

Figure 7:
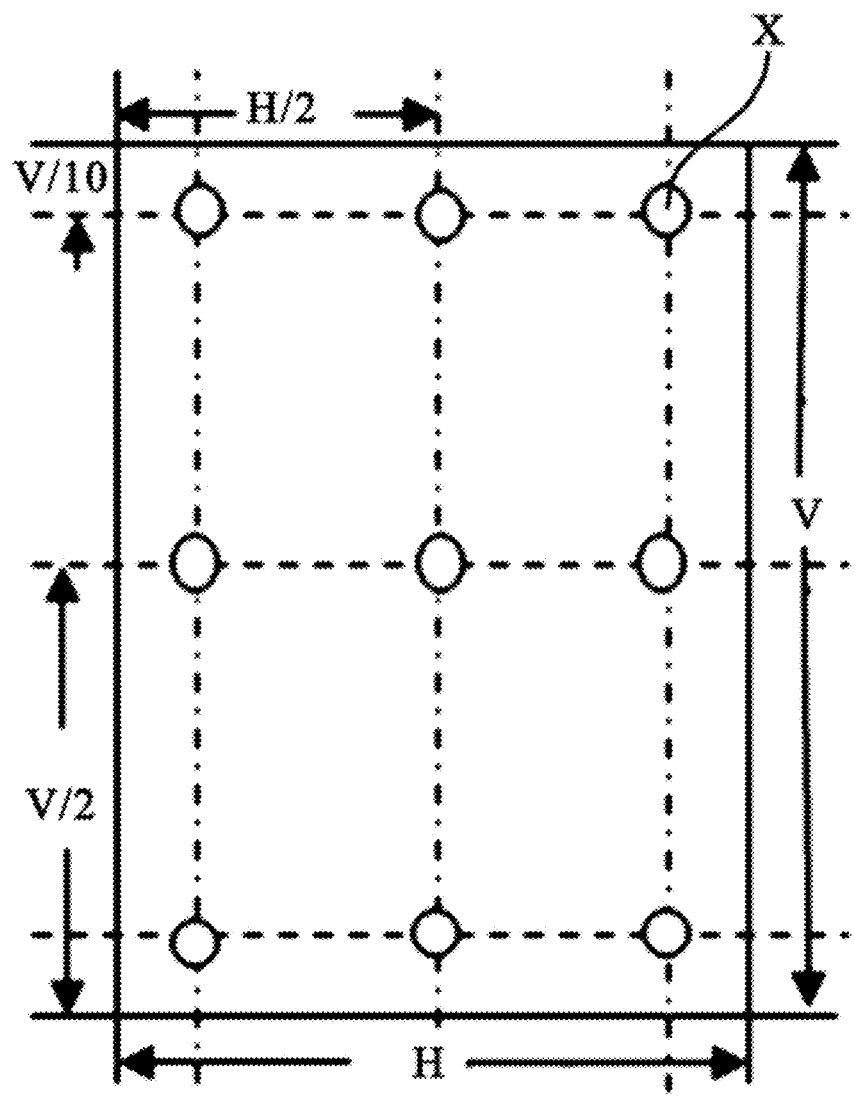
FIG. 7 is a schematic view showing the brightness sampling according to one embodiment of the present disclosure.

It should be appreciated that, FIG. 7 shows a method for testing the brightness uniformity of the screen. Nine regions (e.g., regions X) are selected from the screen, brightness values at the nine regions are tested, and then a minimum brightness value is compared with a maximum brightness value to obtain the brightness uniformity of the screen.

As shown in FIG. 17, in some embodiments of the present disclosure, a length of the pixel region 20 in the first direction is smaller than a length of the pixel region in the second direction. The display substrate further includes: a plurality of gate lines 24, at least a portion of each gate line 24 being arranged at the pixel region 20 and extending in the second direction; and a plurality of data lines 41, at least a portion of each data line 41 being arranged at the pixel region 20 and extending in the first direction.

Figure 19:
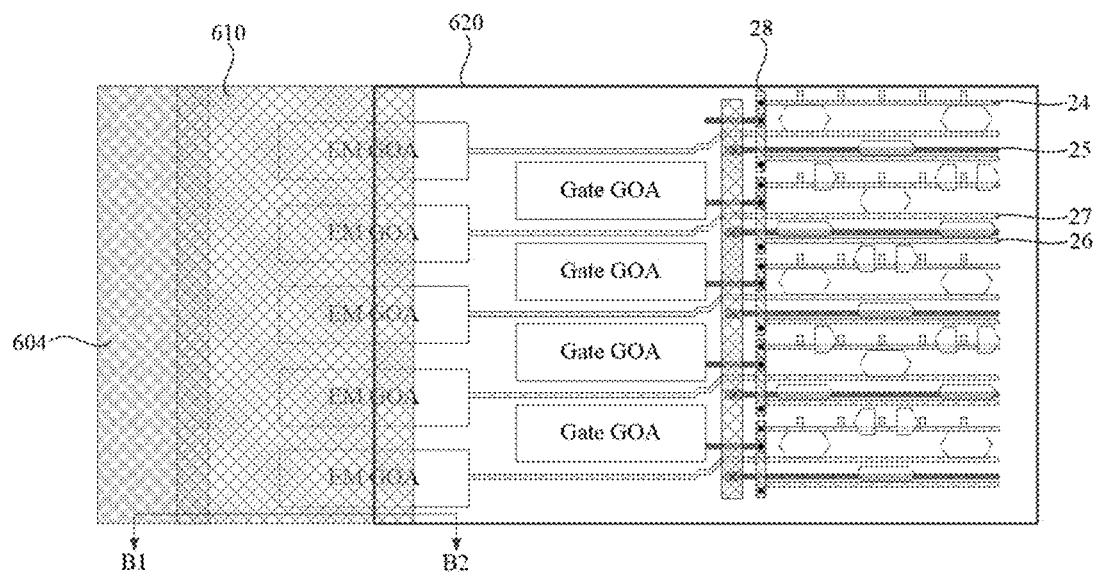
FIG. 19 is an enlarged view of C4 in FIG. 2.

As shown in FIG. 19, for example, the plurality of gate lines 24 is arranged in the first direction, and at least a portion of each gate line 24 extends in the second direction. Each gate line 24 includes a portion arranged at the pixel region 20 and a portion arranged at the peripheral region. The portion at the peripheral region is coupled to a corresponding gate driving circuit GOA, so as to receive a gate scanning signal from the gate driving circuit GOA.

For example, the plurality of data lines 41 is arranged in the second direction, and at least a portion of each data line 41 extends in the first direction. Each data line 41 includes a portion arranged at the pixel region 20 and a portion arranged at the fanout region 30 of the peripheral region.

As shown in FIG. 2, in some embodiments of the present disclosure, a length of the first power source line 21 in the first direction is smaller than a length of the gate line 24 in the second direction.

Based on the above, it is able to effectively reduce the length of the first power source line 21 and reduce the voltage loading on the first power source line 21, thereby to reduce the difference in the brightness of the display substrate between the position close to the driving IC and the position away from the driving IC, and improve the brightness uniformity as well as the image quality.

As shown in FIG. 2, in some embodiments of the present disclosure, the length D1 of the first power source line 21 in the first direction satisfies 20% L2≤D1≤90% L2, where L2 represents a length of the display substrate in the second direction.

Based on the above, it is able to effectively reduce length of the first power source line 21 and reduce the voltage loading on the first power source line 21, thereby to reduce the difference in the brightness of the display substrate between the position close to the driving IC and the position away from the driving IC, and improve the brightness uniformity as well as the image quality.

As shown in FIGS. 2 and 19, in some embodiments of the present disclosure, the display substrate further includes a gate driving circuit GOA, the pixel region 20 is provided with a third side and a fourth side arranged in the second direction, and the gate driving circuit GOA is arranged at at least one of the third side and the fourth side.

For example, the gate driving circuit GOA includes a plurality of Gate GOAs, and each Gate GOA is configured to provide a corresponding scanning signal to the gate line 24 and the resetting signal line 26.

It should be appreciated that, as shown in FIG. 19, the Gate GOA is coupled to the gate line 24 and the resetting signal line 26 through a second transfer pattern 28. For example, the second transfer pattern 28 is arranged at a same layer, and made of a same material, as a data sub-line 41 of the display substrate, so that the second transfer pattern 28 and the data sub-line 41 are formed through a single patterning process. For example, an orthogonal projection of the second transfer pattern 28 onto the base substrate at least partially overlaps an orthogonal projection of an output end of the Gate GOA onto the base substrate, and the second transfer pattern 28 is coupled to the output end of the Gate GOA through a via hole at an overlapping region. The orthogonal projection of the second transfer pattern 28 onto the base substrate at least partially overlaps an orthogonal projection of the gate line 24 onto the base substrate, and the second transfer pattern 28 is coupled to the gate line 24 through a via hole at an overlapping region. The orthogonal projection of the second transfer pattern 28 onto the base substrate at least partially overlaps an orthogonal projection of the resetting signal line 26 onto the base substrate, and the second transfer pattern 28 is coupled to the resetting signal line 26 through a via hole at an overlapping region.

For example, the gate driving circuit GOA further includes a plurality of EM GOAs, and each EM GOA is configured to provide a corresponding scanning signal to a light-emission control signal line 27 of the display substrate.

For example, the gate driving circuit GOA is arranged at two opposite sides of the pixel region 20 in the second direction.

When the gate driving circuit GOA is arranged at at least one side of the pixel region 20 in the second direction, the gate driving circuit GOA is arranged at a side where the short edge of the display substrate is located, so it is able to prevent the gate driving circuit GOA from occupying a space at a side where the long edge of the display substrate is located, thereby to reduce the difficulty in the layout at the side where the long edge of the display substrate is located.

As shown in FIGS. 2, 8a to 10 and 21, in some embodiments of the present disclosure, the display substrate further includes a first power source pattern arranged at the peripheral region. The first power source pattern includes a first sub-pattern 501, the first sub-pattern 501 includes a first straight edge portion 5011 and an arc-like first corner portion 5012 coupled to the first straight edge portion 5011, the first straight edge portion 5011 extends in the second direction and is coupled to the plurality of first power source lines 21, and an angle a between an extension direction of a radius of curvature of the first corner portion 5012 and the second direction satisfies $0° \leq a \leq 90°$.

To be specific, the display substrate further includes the first power source pattern, the first power source pattern and the driving IC of the display substrate are arranged at a same side, and the plurality of first power source lines 21 is coupled to the driving IC through the first power source pattern.

For example, the first power source pattern and the plurality of first power source lines 21 are formed integrally, and arranged at a same layer, and made of a same material, as the data lines.

For example, the first straight edge portion 5011 is arranged at a side where the long edge of the display substrate is located, and at least a part of the first corner portion 5012 is arranged at a corner region of the display substrate.

For example, at least a part of the first straight edge portion 5011 extends to the pixel region 20.

For example, the first straight edge portion 5011 and the first corner portion 5012 are formed integrally.

For example, the direction of the radius of curvature of the first corner portion 5012 is a direction of a radius of curvature of an inner boundary of the first corner portion 5012 adjacent to the pixel region 20, or a direction of a radius of curvature of an outer boundary of the first corner portion 5012 away from the pixel region 20.

For example, the first corner portion 5012 has a first width in the direction of the radius of curvature, and the first width is constant in a direction from the long edge of the display substrate to the short edge of the display substrate.

For example, the first corner portion 5012 has a first width in the direction of the radius of curvature, and the first width increases gradually in a direction from the long edge of the display substrate to the short edge of the display substrate.

Figure 8A:
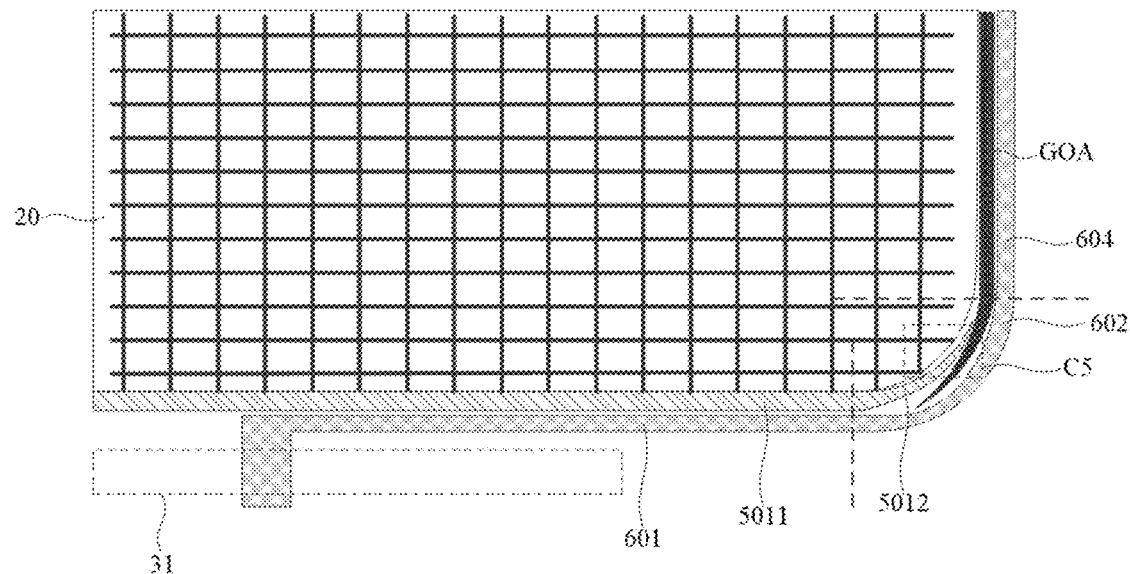
FIG. 8a is an enlarged view of C1 in FIG. 2.
Figure 8B:
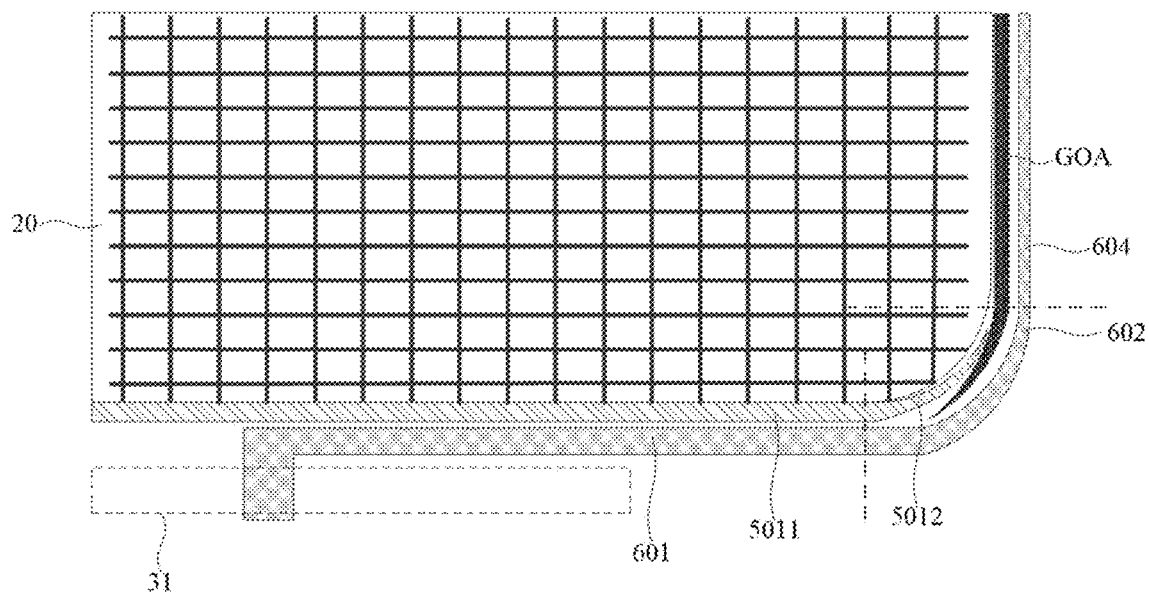
FIG. 8b is another enlarged view of C1 in FIG. 2.
Figure 9:
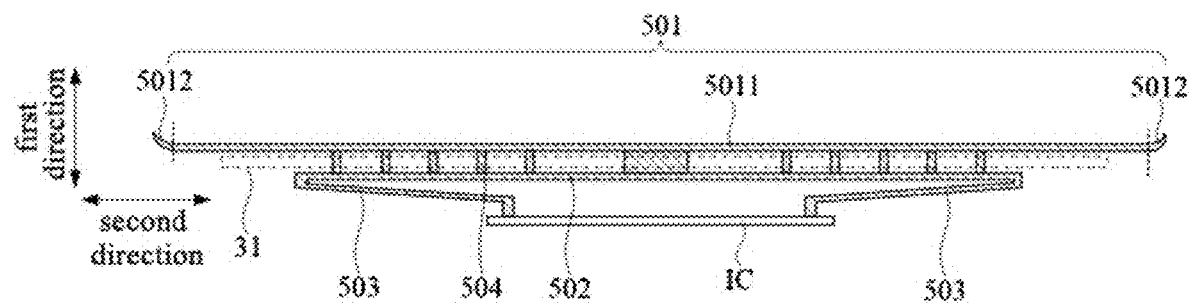
FIG. 9 is a schematic view showing a first power source pattern according to one embodiment of the present disclosure.
Figure 10:
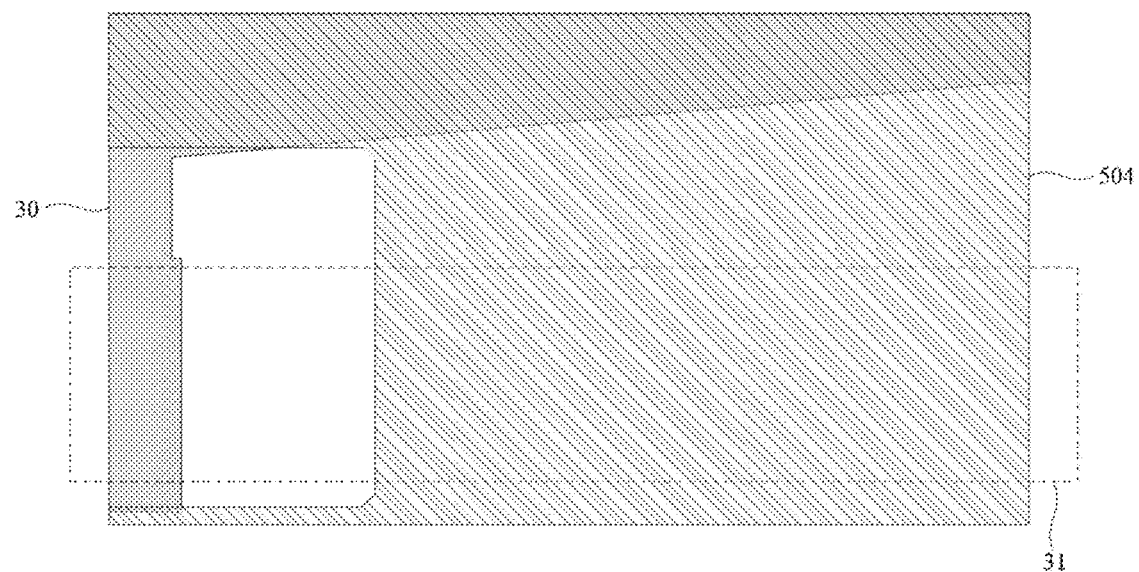
FIG. 10 is an enlarged view of C2 in FIG. 2.

As shown in FIGS. 8a and 8b, for example, the first corner portion 5012 has a first width in the direction of the radius of curvature, and the first width decreases gradually in a direction from the long edge of the display substrate to the short edge of the display substrate.

According to the display substrate in the embodiments of the present disclosure, the first corner portion 5012 is arranged at the corner region of the display substrate, so as to utilize a space at the corner region of the display substrate and reduce a resistance of the first power source pattern, thereby to reduce the voltage loading on the first power source line 21.

As shown in FIGS. 2 and 8a to 10, in some embodiments of the present disclosure, the peripheral region includes a bending region 31. The first power source pattern further includes: a second sub-pattern 502, at least a portion of the second sub-pattern 502 extending in the second direction, the second sub-pattern being arranged at a second side of the bending region 31, the first sub-pattern 501 being arranged at a first side of the bending region 31, the first side and the second side being arranged in the first direction; and a plurality of conductive connection members 504 arranged in the second direction and each extending in the first direction, at least a portion of each conductive connection member 504 being arranged at the bending region 31, and each conductive connection member 504 being coupled to the first sub-pattern 501 and the second sub-pattern 502.

For example, the bending region 31 extends in the second direction.

For example, the first power source pattern is of a one-piece structure.

For example, the first power source pattern further includes two first inlet portions 503 arranged symmetrically, a first end of each first inlet portion 503 is coupled to the driving IC of the display substrate, and two ends of the second sub-pattern 502 are coupled to second ends of the two first inlet portions 503 respectively.

For example, the plurality of conductive connection members 504 are spaced apart from each other at a regular interval in the second direction.

For example, the plurality of conductive connection members 504 includes an odd number of conductive connection members 504, an intermediate conductive connection member 504 in the odd number of conductive connection members 504 overlaps a central line of the pixel region 20 extending in the first direction, and other conductive connection members in the odd number of conductive connection members 504 are arranged symmetrically relative to the intermediate conductive connection member.

For example, a width of the intermediate conductive connection member 504 is greater than a width of the other conductive connection member 504 in the second direction.

For example, the widths of the other conductive connection members 504 are the same in the second direction.

Based on the above, when the first sub-pattern 501 is coupled to the second sub-pattern 502 through the plurality of conductive connection members 504, it is able to ensure the connection performance between the first sub-pattern 501 and the second sub-pattern 502 at the bending region 31 in a better manner.

When the first power source pattern includes the first sub-pattern 501, the second sub-pattern 502 and the plurality of conductive connection members 504, it is able to reduce the resistance of the first power source pattern in a better manner, thereby to improve the brightness uniformity of the display substrate.

As shown in FIGS. 2, 8a, 11a, 11b, 19 and 21, in some embodiments of the present disclosure, the display substrate further includes: a cathode 620, at least a portion of the cathode 620 being arranged at the pixel region 20; and a second power source pattern 60 arranged at the peripheral region and coupled to the cathode 620. The second power source pattern 60 includes a second straight edge portion 601 and a second corner portion 602 coupled to the second straight edge portion 601, the second straight edge portion 601 extends in the second direction, and an angle a between an extension direction of a radius of curvature of the second corner portion 602 and the second direction satisfies $0° \leq a \leq 90°$.

For example, the second power source pattern 60 is configured to transmit a negative power source signal to the cathode 620.

For example, the second power source pattern 60 includes two second inlet portions 603 arranged symmetrically relative to each other, two second straight edge portions 601 arranged symmetrically relative to each other, two second corner portions 602 arranged symmetrically relative to each other, and an enclosing portion 604. A first end of each inlet portion is coupled to the driving IC of the display substrate, the two second straight edge portions 601 correspond to the two second inlet portions 603 respectively, a first end of each second straight edge portion 601 is coupled to a second end of the corresponding second inlet portion 603, the two second corner portions 602 correspond to the two second straight edge portions 601 respectively, a first end of each second corner portion 602 is coupled to a second end of the corresponding second straight edge portion 601, the enclosing portion 604 encloses two short edges and one long edge of the pixel region 20, two ends of the enclosing portion 604 are coupled to second ends of the two second corner portions 602 respectively, and an orthogonal projection of the second power source pattern 60 onto the base substrate of the display substrate surrounds the pixel region 20.

For example, the second power source pattern 60 is of a one-piece structure.

For example, the direction of the radius of curvature of the second corner portion 602 is a direction of a radius of curvature of an inner boundary of the second corner portion 602 adjacent to the pixel region 20, or a direction of a radius of curvature of an outer boundary of the second corner portion 602 away from the pixel region 20.

For example, the second corner portion 602 has a second width in the direction of the radius of curvature, and the second width is constant in a direction from the long edge of the display substrate to the short edge of the display substrate.

Figure 11A:
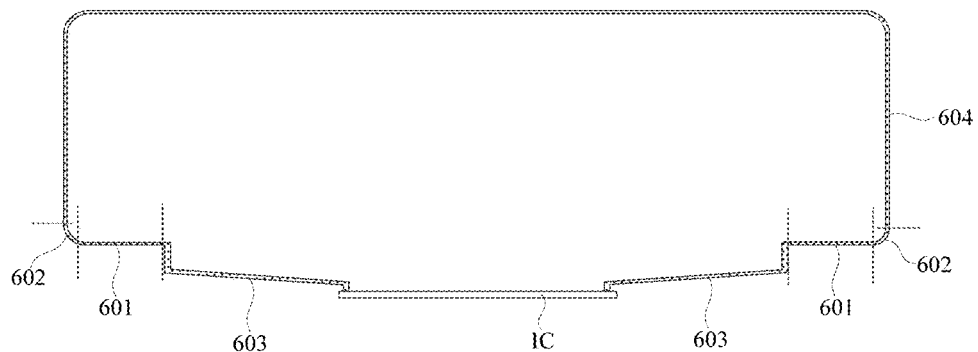
FIG. 11a is a schematic view showing a second power source pattern according to one embodiment of the present disclosure.

As shown in FIGS. 8a and 11a, for example, the second corner portion 602 has a second width in the direction of the radius of curvature, and the second width increases gradually in a direction from the long edge of the display substrate to the short edge of the di splay substrate.

Figure 11B:
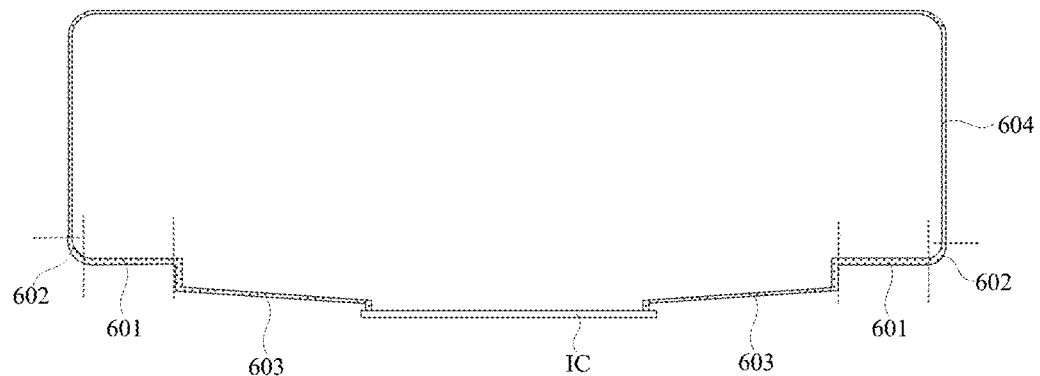
FIG. 11b is another schematic view showing the second power source pattern according to one embodiment of the present disclosure.

As shown in FIGS. 8b and 11b, for example, the second corner portion 602 has a second width in the direction of the radius of curvature, and the second width decreases gradually in a direction from the long edge of the display substrate to the short edge of the di splay substrate.

According to the display substrate in the embodiments of the present disclosure, the second corner portion 602 is arranged at the corner region of the display substrate, so as to utilize a space at the corner region of the display substrate and reduce a resistance of the second power source pattern 60, thereby to improve the brightness uniformity of the display substrate.

As shown in FIGS. 2, 9, 19 and 20, in some embodiments of the present disclosure, the orthogonal projection of the first power source pattern onto the base substrate of the display substrate is located between the orthogonal projection of the pixel region 20 onto the base substrate and an orthogonal projection of a portion of the second power source pattern 60 onto the base substrate.

As shown in FIGS. 2, 9, 19 and 20, in some embodiments of the present disclosure, the display substrate further includes a first transfer pattern 610, an orthogonal projection of the first transfer pattern 610 onto the base substrate 40 of the display substrate overlaps an orthogonal projection of the second power source pattern 60 (e.g., the enclosing portion 604) onto the base substrate 40 at a first overlapping region and overlaps an orthogonal projection of the cathode 620 onto the base substrate 40 at a second overlapping region, and the first transfer pattern 610 is coupled to the second power source pattern 60 (e.g., the enclosing portion 604) through a via hole in the first overlapping region and coupled to the cathode 620 through a via hole in the second overlapping region.

For example, the first transfer pattern 610 is arranged at a same layer, and made of a same material, as the anode.

Figure 20:
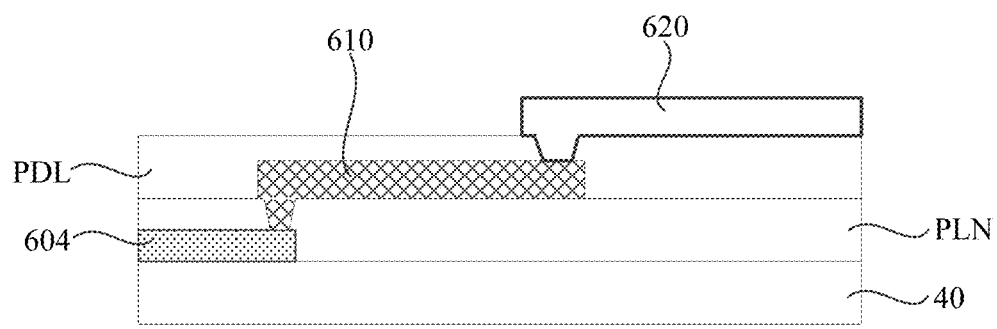
FIG. 20 is a sectional view of C4 along line B1-B2 in FIG. 19.
Figure 21:
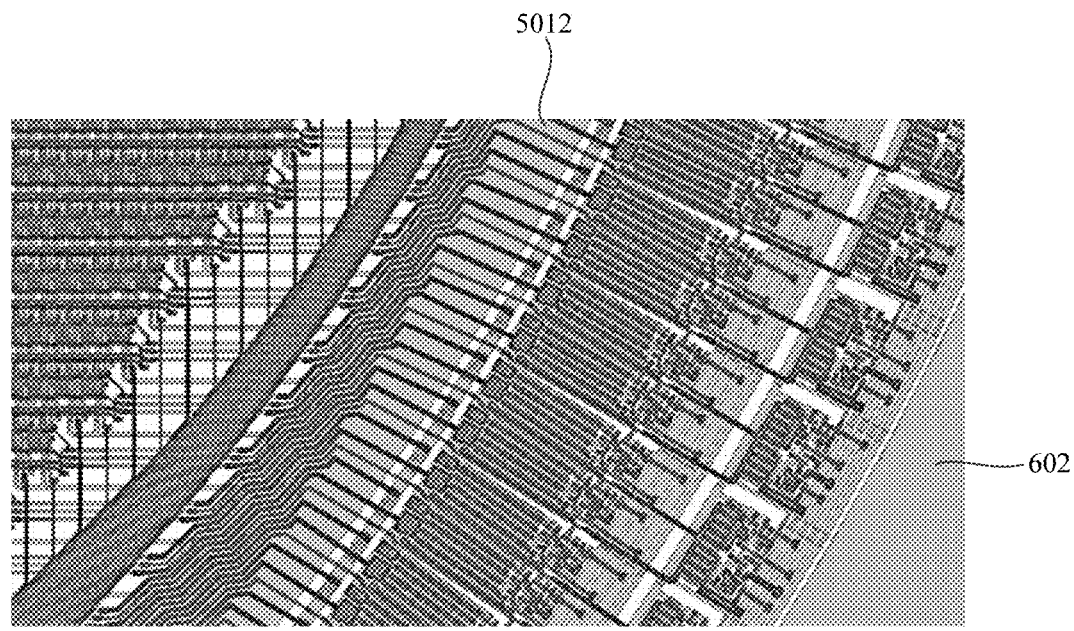

It should be appreciated that, FIG. 20 further shows a planarization layer PLN and a pixel definition layer PDL.

In some embodiments of the present disclosure, the first transfer pattern 610 surrounds the pixel region 20. In this way, the cathode 620 is electrically coupled to the second power source pattern 60 at the periphery of the pixel region at a large area, so as to reduce an IR drop across the cathode in a better manner.

As shown in FIGS. 2 and 3, in some embodiments of the present disclosure, the plurality of data lines includes data sub-lines 41 corresponding to the subpixels, and the plurality of first power source lines 21 includes first power source sub-lines 210 corresponding to the sub-pixels. Each subpixel includes a subpixel driving circuit, and the plurality of subpixel driving circuits are arranged in an array form, i.e., in rows and columns. The subpixel driving circuits in each row include a plurality of subpixel driving circuits arranged in the second direction, and the subpixel driving circuits in each column include a plurality of subpixel driving circuits arranged in the first direction. The data sub-lines 41 corresponding to the subpixel driving circuits in a same column are coupled in an end-to-end manner to form one data line, and the first power source sub-lines 210 corresponding to the subpixel driving circuits in a same column are coupled in an end-to-end manner to form one first power source line 21.

For example, the subpixel driving circuit is of a 7T1C structure.

For example, the data sub-lines 41 corresponding to the subpixel driving circuits in a same column are coupled in an end-to-end manner to form a one-piece structure.

For example, the first power sub-lines 210 corresponding to the subpixel driving circuits in a same column are coupled in an end-to-end manner to form a one-piece structure.

It should be appreciated that, the user experience is adversely affected by a difference in the display effect of the display substrate at a right viewing angle and a left viewing angle, so the color offset symmetry of the display substrate also needs to meets a corresponding standard. The smaller the color offset difference (ΔJNCD) at the right viewing angle and the left viewing angle having a same value, the better the display effect of the display substrate, and the more easily the resultant display product is recognized and accepted by consumers. In a current OLED display product, the color offset symmetry is commonly poor, and this is strongly correlated with flatness of an anode layer in RGB subpixels. Hence, there is an urgent need in the display industry to optimize the flatness of the anode layer, so as to improve the color offset symmetry of the display product.

In the related art, based on a GGRB pixel arrangement structure, due to a stretching way of a Fine Metal Mask (FMM), an anode of each of the RGB subpixels is arranged at a position relative to a signal line at a bottom layer in such a manner that an extension direction of a long edge of an opening region of the subpixel is parallel to the signal line at the bottom layer. Hence, during the design of the display substrate, the position of the anode relative to the signal line at the bottom layer is very important. When the signal line at the bottom layer is arranged asymmetrically relative to the anode of the subpixel, the anode of the subpixel protrudes, and the light exiting is adversely affected. At this time, proportions of each of the colors RGB at the right viewing angle and the left viewing angle are different, and the color offset asymmetry easily occurs. In addition, due to the limit of a size of the display substrate, it is difficult to enable the signal line at the bottom layer to completely avoid the anode of the subpixel, so the color offset asymmetry exists continuously. Hence, it is very important to eliminate the color offset asymmetry through changing the design.

As shown in FIGS. 3 and 4, in some embodiments of the present disclosure, an orthogonal projection of the first pixel block 221 onto the base substrate of the display substrate overlaps an orthogonal projection of the data sub-line 41' corresponding to the subpixel to which the first subpixel block 221 belongs onto the base substrate at a first overlapping region, and/or overlaps an orthogonal projection of the first power source sub-line 210' corresponding to the subpixel to which the first subpixel block 221 belongs onto the base substrate at a second overlapping region. The first overlapping region and the second overlapping region are arranged opposite to each other in the second direction.

For example, the data sub-line is arranged at a same layer, and made of a same material, as the first power source sub-line.

For example, the data sub-line and the first power source sub-line are both made of a first source-drain metal line or a second source-drain metal layer of the display substrate.

Based on the above, it is able to improve the flatness of the first pixel block 221, thereby to improve the color offset for the pair of subpixels 22 in the first color effectively.

In some embodiments of the present disclosure, a width of the first overlapping region in the first direction is smaller than or equal to a maximum width of the first pixel block 221 in the first direction, and/or a width of the second overlapping region in the first direction is smaller than or equal to the maximum width of the first pixel block 221 in the first direction.

Based on the above, it is able to improve the flatness of the first pixel block 221 in both the first direction and the second direction, thereby to improve the color offset for the pair of subpixels 22 in the first color in a better manner.

In some embodiments of the present disclosure, an orthogonal projection of the second pixel block 222 onto the base substrate of the display substrate overlaps an orthogonal projection of the data sub-line 41' corresponding to an adjacent subpixel in the second direction at a third overlapping region, and overlaps an orthogonal projection of the first power source sub-line 210 corresponding to the adjacent subpixel in the second direction at a fourth overlapping region. The third overlapping region and the fourth overlapping region are arranged opposite to each other in the second direction.

Based on the above, it is able to improve the flatness of the second pixel block 222, thereby to improve the color offset for the pair of subpixels in the second color effectively.

In some embodiments of the present disclosure, a width of the third overlapping region in the first direction is smaller than or equal to a maximum width of the second pixel block 222 in the first direction, and/or a width of the fourth overlapping region in the first direction is smaller than or equal to the maximum width of the second pixel block 222 in the first direction.

Based on the above, it is able to improve the flatness of the second pixel block 222 in both the first direction and the second direction, thereby to improve the color offset for the pair of subpixels in the second color in a better manner.

As shown in FIGS. 3 and 4, in some embodiments of the present disclosure, at least a part of the subpixels in the other colors include a subpixel 231 in a second color and a subpixel 233 in a third color, at least a portion of an anode 2311 of the subpixel 231 in the second color extends in the second direction, and at least a portion of an anode 2331 of the subpixel 233 in the third color extends in the second direction.

According to the display substrate in the embodiments of the present disclosure, the position of the anode of each subpixel relative to the data sub-line and the first power source sub-line under the anode is changed. For example, when the angle between the first direction and the second direction is 90°, as shown in FIG. 3, the extension direction of the anode is perpendicular to an extension direction of each of the data sub-line 41 (41') and the first power source sub-line 210 (210'), so that the orthogonal projections of the data sub-line 41 and the first power source sub-line 210 onto the base substrate pass through an orthogonal projection of the anode onto the base substrate in the first direction. The anode has a small width in the first direction, so it is able to obviously improve the color offset asymmetry of a display panel at the left viewing angle and the right viewing angle.

A length of the anode of each subpixel in the second direction is greater than a length of the anode in the first direction. On one hand, a slope of the anode in a long edge direction (i.e., the second direction) is less affected by the data sub-line and the first power source sub-line, and on the other hand, the color offset symmetry at a viewing angle in the long edge direction is also less affected by a slope of the pixel block, so it is able to improve the color offset asymmetry in the long edge direction of the subpixel, i.e., at upper and lower viewing angles of the display panel.

As shown in FIGS. 3 and 4, in some embodiments of the present disclosure, in the subpixels in the other colors, the orthogonal projection of the anode onto the base substrate of the display substrate overlaps an orthogonal projection of the data sub-line 41 corresponding to the subpixel to which the anode belongs onto the base substrate at a fifth overlapping region.

In some embodiments of the present disclosure, in the subpixels in the other colors, the orthogonal projection of the anode onto the base substrate of the display substrate overlaps an orthogonal projection of the data sub-line 41' corresponding to the adjacent subpixel in the second direction onto the base substrate at a sixth overlapping region.

In some embodiments of the present disclosure, the fifth overlapping region and the sixth overlapping region are arranged opposite to each other in the second direction.

Based on the above, it is able to improve the flatness of the anodes in the subpixels in the other colors, thereby to improve the color offset for the subpixels in the other colors.

In some embodiments of the present disclosure, a width of the fifth overlapping region in the first direction is smaller than or equal to a maximum width of the anode in the first direction, and/or a width of the sixth overlapping region in the first direction is smaller than or equal to the maximum width of the anode in the first direction.

Based on the above, it is able to improve the flatness of the anodes in the subpixels in the other colors in both the first direction and the second direction, thereby to improve the color offset for the subpixels in the other colors in a better manner.

In some embodiments of the present disclosure, in the subpixels in the other colors, the orthogonal projection of the anode onto the base substrate overlaps the orthogonal projection of the first power source sub-line 210 corresponding to the subpixel to which the anode belongs onto the base substrate at a seventh overlapping region.

In some embodiments of the present disclosure, in the subpixels in the other colors, the orthogonal projection of the anode onto the base substrate overlaps the orthogonal projection of the first power source sub-line 210' corresponding to the adjacent subpixel in the second direction onto the base substrate at an eighth overlapping region.

In some embodiments of the present disclosure, the seventh overlapping region and the eighth overlapping region are arranged opposite to each other in the second direction.

Based on the above, it is able to improve the flatness of the anodes in the subpixels in the other colors, thereby to improve the color offset for the subpixels in the other colors.

In some embodiments of the present disclosure, a width of the seventh overlapping region in the first direction is smaller than or equal to the maximum width of the anode in the first direction, and/or a width of the eighth overlapping region in the first direction is smaller than or equal to the maximum width of the anode in the first direction.

Based on the above, it is able to improve the flatness of the anodes in the subpixels in the other colors in both the first direction and the second direction, thereby to improve the color offset for the subpixels in the other colors in a better manner.

Figure 12:
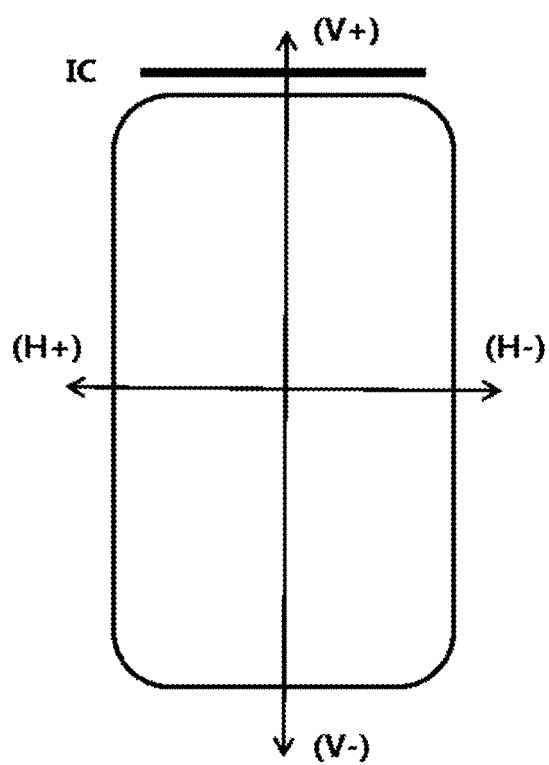
FIG. 12 shows a scheme for a display product in the related art.
Figure 13:
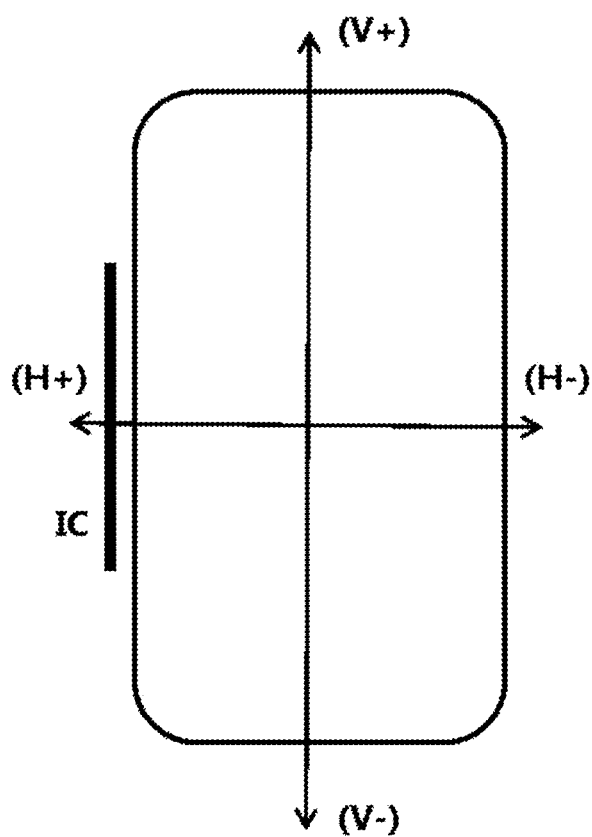
FIG. 13 shows a scheme for a display product according to one embodiment of the present disclosure.

More specifically, FIG. 12 shows a scheme for a conventional display product, and FIG. 13 shows a scheme in the embodiments of the present disclosure. The long edge of the display substrate extends in a direction V, and the short edge extends in a direction H, and a color difference at a same viewing angle in V+, V−, H+ and H− is represented by a Just Noticeable Color Difference (JNCD) value. The smaller the JNCD value, the better the color offset symmetry of the display substrate. Taking the extension direction of the short edge as an example, when chromaticity at a certain viewing angle in H+ is (u1, v1) and chromaticity at a same viewing angle in H− is (u2, v2), the color difference at the viewing angle in H is $\Delta JNCD=[(u1-u2)^2+(v1-v2)^2]^{0.5}/0.004$.

Figure 14:
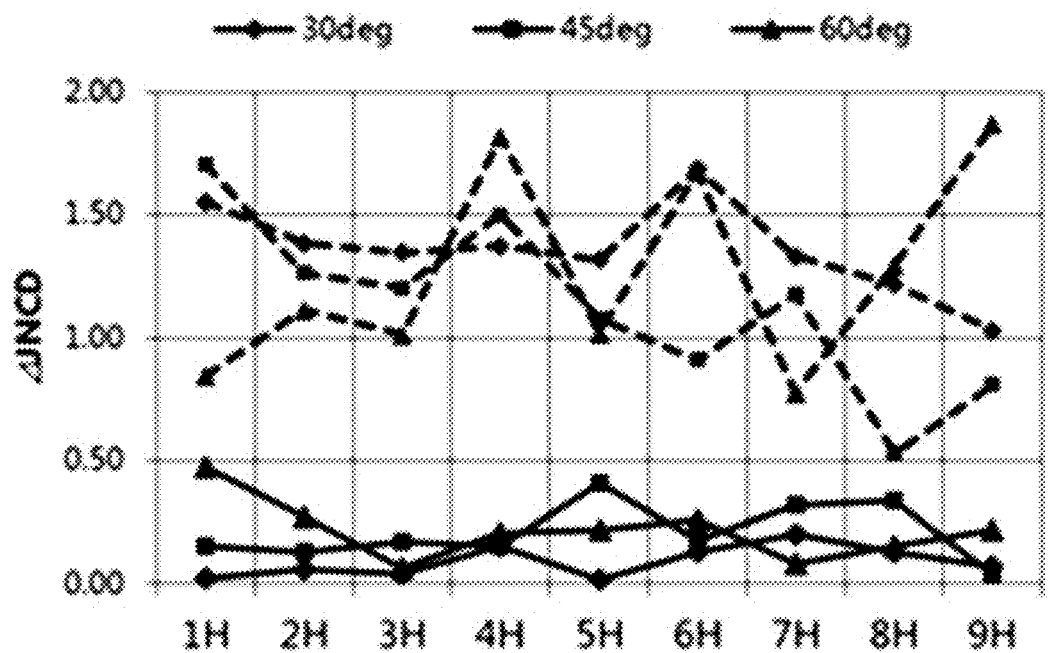
FIG. 14 is a curve diagram of horizontal direction (H-direction) color offset symmetry.

Influences of the two schemes on the color offset symmetry are validated for display substrates with a same size, and FIG. 14 shows a comparison result. Chromaticity coordinates are tested at different viewing angles in the extension direction of the short edge (i.e., the direction H) of the display products in the two schemes, and the JNCD differences at viewing angles 30°, 45° and 60° are selected for the comparison in the direction H. In FIG. 14, a dotted line indicates measured data of the conventional display product, and a solid line indicates measured data of the display substrate in the embodiments of the present disclosure. As shown in FIG. 14, $\Delta JNCD$ of the display substrate in the embodiments of the present disclosure is smaller than 0.5JNCD at the viewing angles, which is obviously smaller than that of the conventional display product.

Figure 15:
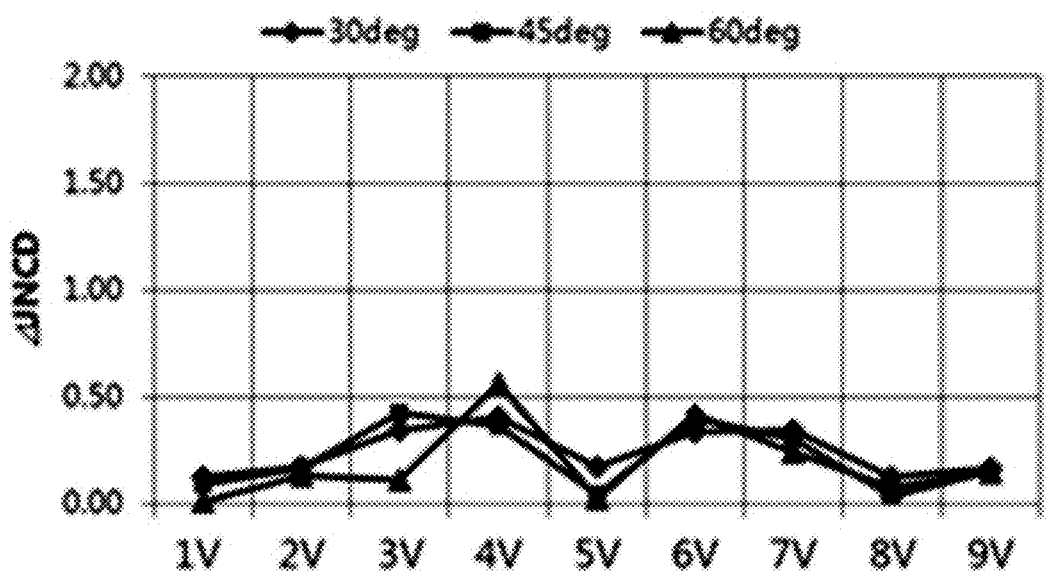
FIG. 15 is a curve diagram of vertical direction (V-direction) color offset symmetry.

In addition, chromaticity coordinates are tested at different viewing angles in the extension direction of the long edge (i.e., the direction V) of the display substrate in the embodiments of the present disclosure, the JNCD differences at viewing angles 30°, 45° and 60° are calculated in the direction V, and FIG. 15 shows a result. As shown in FIG. 15, $\Delta JNCD$ of the tested display substrates at the viewing angles in the extension direction of the long edge is smaller than 0.5JNCD, i.e., the color offset symmetry is excellent. Hence, according to the display substrate in the embodiments of the present disclosure, it is able to improve the color offset symmetry obviously in both the extension direction of the long edge and the extension direction of the short edge of the display substrate, thereby to improve the performance of the display product as well as the user experience in a better manner.

Figure 16:
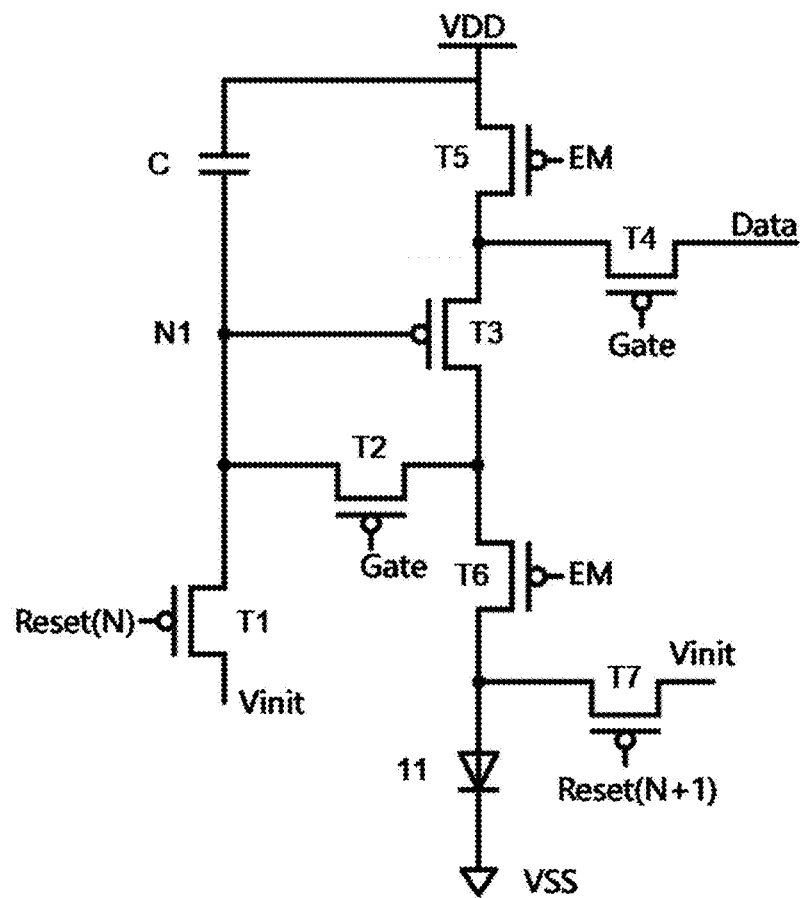
FIG. 16 is a schematic view showing a pixel driving circuit according to one embodiment of the present disclosure.

As shown in FIGS. 3 and 16, in some embodiments of the present disclosure, each subpixel includes a light-emitting element and a pixel driving circuit, the light-emitting element includes a cathode, a light-emitting layer and an anode laminated one on another, the anode is arranged between the light-emitting layer and a base substrate of the display substrate, the pixel driving circuit includes a driving transistor, a threshold compensation transistor and a first connection member 70 arranged between the anode and the base substrate, the first connection member 70 extends in the first direction, a first electrode of the threshold compensation transistor is electrically coupled to a first electrode of the driving transistor, and a second electrode of the threshold compensation transistor is electrically coupled to a gate electrode of the driving transistor T3 through the first connection member 70.

The first pixel block includes a first active light-emitting region (e.g., a region where the first organic light-emitting pattern 2210 is located), and the second pixel block includes a second active light-emitting region (e.g., a region where the second organic light-emitting pattern 2220 is located). In the first pixel block, a minimum distance between an orthogonal projection of the first connection member 70 onto a straight line extending in the second direction and an orthogonal projection of the first active light-emitting region onto the straight line is a first distance, or the orthogonal projection of the first connection member 70 onto the straight line extending in the second direction overlaps the orthogonal projection of the first active light-emitting region onto the straight line. In the second pixel block, a minimum distance between the orthogonal projection of the first connection member 70 onto the straight line and an orthogonal projection of the second active light-emitting region onto the straight line is a second distance, and the first distance is smaller than the second distance.

In the first pixel block, an overlapping area between an orthogonal projection of the anode onto the base substrate and the orthogonal projection of the first connection member 70 onto the base substrate is a first overlapping area, in the second pixel block, an overlapping area between the orthogonal projection of the anode onto the base substrate and the orthogonal projection of the first connection member

70 onto the base substrate is a second overlapping area, and a ratio of the first overlapping area to the second overlapping area is 0.8 to 1.2.

For example, the first connection member 70 is arranged at a same layer, and made of a same material, as the data line.

For example, the light-emitting layer is made of an organic light-emitting material.

For example, the first active light-emitting region and the second active light-emitting region are used to form a region for the light-emitting layer.

Each pixel driving circuit includes a data write-in transistor T4, a driving transistor T3, a threshold compensation transistor T2 and a first resetting control transistor T7. A first electrode of the threshold compensation transistor T2 is coupled to a first electrode of the driving transistor T3, and a second electrode of the threshold compensation transistor T2 is coupled to a gate electrode of the driving transistor T3. A first electrode of the first resetting control transistor T7 is coupled to a resetting power source signal line to receive a resetting signal Vinit, and a second electrode of the first resetting control transistor T7 is coupled to a light-emitting unit. A first electrode of the data write-in transistor T4 is coupled to a second electrode of the driving transistor T3. For example, the pixel driving circuit of each subpixel further includes a storage capacitor C, a first light-emission control transistor T6, a second light-emission control transistor T5 and a second resetting transistor T1. A gate electrode of the data write-in transistor T4 is coupled to a scanning signal line to receive a scanning signal Gate. A first electrode of the storage capacitor C is electrically coupled to a power source signal line, and a second electrode of the storage capacitor C is electrically coupled to the gate electrode of the driving transistor T3. A gate electrode of the threshold compensation transistor T2 is electrically coupled to the scanning signal line to receive a compensation control signal. A gate electrode of the first resetting transistor T7 is electrically coupled to a resetting control signal line to receive a resetting control signal Reset(N+1). A first electrode of the second resetting transistor T1 is electrically coupled to the resetting power source signal line to receive the resetting signal Vinit, a second electrode of the second resetting transistor T1 is electrically coupled to the gate electrode of the driving transistor T3, and a gate electrode of the second resetting transistor T1 is electrically coupled to the resetting control signal line to receive a resetting control signal Reset (N). A gate electrode of the first light-emission control transistor T6 is electrically coupled to a light-emission control signal to receive a light-emission control signal EM. A first electrode of the second light-emission control transistor T5 is electrically coupled to the power source signal line to receive a first power source signal VDD, a second electrode of the second light-emission control transistor T5 is electrically coupled to the second electrode of the driving transistor T3, and a gate electrode of the second light-emission control transistor T5 is electrically coupled to the light-emission control signal line to receive the light-emission control signal EM. A cathode of the light-emitting element 11 is coupled to a voltage end VSS. The power source signal line refers to a signal line for outputting the voltage signal VDD, and it is coupled to a power source to output a constant voltage signal, e.g., a positive voltage signal.

When the display substrate has the above-mentioned structure, it is able to reduce a layout space occupied by each subpixel, thereby to improve the resolution of the display substrate.

As shown in FIG. 3, in some embodiments of the present disclosure, each subpixel includes a light-emitting element and a pixel driving circuit for driving the light-emitting element, the light-emitting element includes a cathode, a light-emitting layer and an anode laminated one on another in a direction close to the base substrate of the display substrate, and the anode includes a body electrode and a connection electrode.

The plurality of subpixels includes a plurality of subpixels 233 in a third color and a plurality of subpixels 231 in a second color, each subpixel 233 in the third color includes a third active light-emitting region (e.g., a region where the third organic light-emitting pattern 2330 is located), the body electrode of the subpixel 233 in the third color has a same shape as the third active light-emitting region, an orthogonal projection of the third active light-emitting region onto the base substrate is located within an orthogonal projection of the body electrode onto the base substrate, each subpixel 231 in the second color includes a fourth active light-emitting region (e.g., a region where the fourth organic light-emitting pattern 2310 is located), the body electrode of the subpixel 231 in the second color has a same shape as the fourth active light-emitting region, and an orthogonal projection of the fourth active light-emitting region onto the base substrate is located within an orthogonal projection of the body electrode onto the base substrate.

The plurality of data lines (e.g., 41 and 41') is arranged at a side of the anode facing the base substrate, and the body electrode of at least one of the subpixel 233 in the third color and the subpixel 231 in the second color overlaps at least two data lines.

The display substrate further includes: a planarization layer arranged between a film layer where the plurality of data lines is located and a film layer where the anode is located; and an interlayer insulation layer arranged between the film layer where the plurality of data lines is located and the base substrate of the display substrate. Each subpixel includes a second connection member 232 arranged at a same layer as the data line. In the subpixel 233 in the third color, the connection electrode is electrically coupled to the second connection member 232 through a first via hole penetrating through the planarization layer, and the second connection member 232 is electrically coupled to the pixel driving circuit through a first connection hole penetrating through the interlayer insulation layer. In a direction perpendicular to the base substrate, the first via-hole and the first connection hole do not overlap the body electrode, and an orthogonal projection of the first via hole onto a first straight line extending in the first direction overlaps an orthogonal projection of the first connection hole onto the first straight line.

For example, the body electrode of the subpixel 233 in the third color and the third active light-emitting region are each of a hexagonal shape.

For example, the body electrode of the subpixel 231 in the second color and the fourth active light-emitting region are each of a hexagonal shape.

For example, the subpixels in the second color include one or more of a red subpixel, a blue subpixel and a green subpixel, and the subpixels in the third color include one or more of a red subpixel, a blue subpixel and a green subpixel.

For example, the body electrode of at least one of the subpixel 233 in the third color and the subpixel 231 in the second color overlaps two data lines (e.g., 41 and 41'), and the two data lines are arranged in the second direction.

For example, the subpixel 233 in the third color includes an anode 2331, and the subpixel 231 in the second color includes an anode 2311.

When the display substrate has the above-mentioned structure, it is able to not only reduce the layout space occupied by each subpixel to improve the resolution of the display substrate, but also improve the flatness of the body electrode of each subpixel to prevent the occurrence of the color offset for the display substrate.

As shown in FIG. 3, in some embodiments of the present disclosure, each subpixel includes a light-emitting element, the light-emitting element includes a cathode, a light-emitting layer and an anode laminated one on another, the cathode is arranged at a side of the anode away from a base substrate of the display substrate, the plurality of subpixels includes a plurality of subpixels 231 in a second color, each subpixel 231 in the second color includes a fourth active light-emitting region (e.g., a region where the fourth organic light-emitting pattern 2310 is located), the plurality of data lines is arranged at a side of the anode facing the base substrate of the display substrate, and each subpixel further includes a second connection member 232 arranged at a same layer as the plurality of data lines and coupled to the anode.

In a direction perpendicular to the base substrate, the anode 2311 of each subpixel 231 in the second color overlaps the data line (e.g., 41 and 41'), the first power source line 21 and the second connection member 232, and in portions of the data line, the first power source line and the second connection member 232 overlapping the anode, the first power source line 21 and the data line are arranged at two sides of the second connection member 232 respectively. The second connection member 232 includes a first connection sub-member 2320 and a second connection sub-member 2321 coupled to the first connection sub-member 2320 and arranged at a side of the first connection sub-member 2320 adjacent to the first power source line, and the first connection sub-member 2320 and the second connection sub-member 2321 overlap the anode. In the first direction, a size of the first connection sub-member 2320 is greater than a size of the second connection sub-member 2321, and a ratio of a minimum distance between adjacent edges of the first connection sub-member 2320 and the data line to a minimum distance between adjacent edges of the second connection sub-member 2321 and the first power source line is 0.4 to 2.2.

For example, the subpixels in the second color include one or more of a red subpixel, a blue subpixel and a green subpixel.

When the display substrate has the above-mentioned structure, it is able to not only reduce the layout space occupied by each subpixel to improve the resolution of the display substrate, but also improve the flatness of the body electrode of each subpixel to prevent the occurrence of the color offset for the display substrate.

The present disclosure further provides in some embodiments a display device which includes the above-mentioned display substrate.

According to the display substrate in the embodiments of the present disclosure, the length of the pixel region 20 in the first direction is smaller than the length thereof in the second direction, at least a portion of the data line extends in the first direction, at least a portion of the first power source line 21 extends in the first direction, and the fanout region 30 is arranged at a side of the pixel region 20 in the first direction, so that the data line and first power source line 21 extend along a short edge of the display substrate and the fanout region 30 is arranged at a side where a long edge of the display substrate is located. Hence, as shown in FIG. 5, in the display substrate according to the embodiments of the present disclosure, a length of the first power source line 21 is changed from being approximate to L2 to being approximate to L1. An IR drop across the first power source line 21 is in direct proportion to its length, and after the length of the first power source line 21 has been reduced, the voltage loading on the first power source line 21 decreases. As a result, it is able to reduce a difference in brightness of the display substrate between a position close to the driving IC and a position away from the driving IC, thereby to improve the brightness uniformity as well as the image quality.

In addition, according to the display substrate in the embodiments of the present disclosure, it is able to improve the color offset.

When the display device includes the above-mentioned display substrate, it also has the above-mentioned beneficial effects, which will not be particularly defined herein.

It should be appreciated that, the display device may be any product or member having a display function, e.g., television, display, digital photo frame, mobile phone or tablet computer.

The present disclosure further provides in some embodiments a method for manufacturing a display substrate. The display substrate includes a pixel region 20 and a peripheral region arranged at a periphery of the pixel region 20. An angle between a second direction and a first direction is 80° to 100°. The method includes: forming a plurality of first power source lines 21, at least a portion of each first power source line 21 being arranged at the pixel region 20 and extending in the first direction; forming a fanout region 30 at the peripheral region, the pixel region being provided with a first side and a second side arranged in the first direction, the fanout region being arranged at the first side; forming a plurality of subpixels at the pixel region 20, the plurality of subpixels including at least one pair of subpixels 22 in a first color and a plurality of sub-pixels in the other colors. Each pair of subpixels 22 in the first color include a first pixel block 221 and a second pixel block 222 arranged in the second direction and both emitting light in the first color, and a minimum distance between the first pixel block 221 and the second pixel block 222 in each pair of subpixels 22 in the first color is smaller than or equal to a minimum distance between two subpixels in a same color in the plurality of subpixels in the other colors.

For example, a length of the pixel region 20 in the first direction is smaller than a length of the pixel region 20 in the second direction.

According to the display substrate manufactured through the method in the embodiments of the present disclosure, the length of the pixel region 20 in the first direction is smaller than the length thereof in the second direction, at least a portion of data line extends in the first direction, at least a portion of the first power source line 21 extends in the first direction, and the fanout region 30 is arranged at a side of the pixel region 20 in the first direction, so that the data line and the first power source line 21 extends along a short edge of the display substrate and the fanout region 30 is arranged at a side where a long edge of the display substrate is located. Hence, as shown in FIG. 5, in the display substrate according to the embodiments of the present disclosure, a length of the first power source line 21 is changed from being approximate to L2 to being approximate to L1. An IR drop across the first power source line 21 is in direct proportion to its length, and after the length of the first power source line 21 has been reduced, the voltage loading on the first power source line 21 decreases. As a result, it is able to reduce a difference in brightness of the display substrate between a position close to the driving IC and a position away from the driving IC, thereby to improve the brightness uniformity as well as the image quality.

In addition, according to the display substrate manufactured through the method in the embodiments of the present disclosure, it is able to improve the color offset.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising:
a pixel region and a peripheral region arranged at a periphery of the pixel region;
a plurality of first power source lines, at least a portion of each first power source line being arranged at the pixel region and extending in a first direction;
a fanout region arranged at the peripheral region, the pixel region being provided with a first side and a second side arranged in the first direction, the fanout region being arranged at the first side; and
a plurality of subpixels arranged at the pixel region and comprising at least one pair of subpixels in a first color and a plurality of sub-pixels in the other colors,
wherein each pair of subpixels in the first color comprise a first pixel block and a second pixel block arranged in a second direction and both emitting light in the first color, a minimum distance between the first pixel block and the second pixel block in each pair of subpixels in the first color is smaller than a minimum distance between two subpixels in a same color in the plurality of subpixels in the other colors, and an angle between the second direction and the first direction is 80° to 100°;
wherein a length of the pixel region in the first direction is smaller than a length of the pixel region in the second direction.

2. The display substrate according to claim 1, wherein the display substrate further comprises:
a plurality of gate lines, at least a portion of each gate line being arranged at the pixel region and extending in the second direction; and
a plurality of data lines, at least a portion of each data line being arranged at the pixel region and extending in the first direction.

3. The display substrate according to claim 2, wherein a length of the first power source line in the first direction is smaller than a length of the gate line in the second direction.

4. The display substrate according to claim 1, wherein a length D1 of the first power source line in the first direction satisfies 20% L2≤D1≤90% L2, wherein L2 represents a length of the display substrate in the second direction.

5. The display substrate according to claim 1, further comprising a gate driving circuit, wherein the pixel region is provided with a third side and a fourth side arranged in the second direction, and the gate driving circuit is arranged at the third side and/or the fourth side.

6. The display substrate according to claim 1, further comprising a first power source pattern arranged at the peripheral region, wherein the first power source pattern comprises:
a first sub-pattern, wherein the first sub-pattern comprises a first straight edge portion and an arc-like first corner portion coupled to the first straight edge portion, the first straight edge portion extends in the second direction and is coupled to the plurality of first power source lines, and an angle a between an extension direction of a radius of curvature of the first corner portion and the second direction satisfies 0°≤a≤90°.

7. The display substrate according to claim 6, wherein the peripheral region comprises a bending region,
the first power source pattern further comprises:
a second sub-pattern, at least a portion of the second sub-pattern extending in the second direction, the second sub-pattern being arranged at a second side of the bending region, the first sub-pattern being arranged at a first side of the bending region, the first side and the second side being arranged in the first direction; and
a plurality of conductive connection members arranged in the second direction and each extending in the first direction, at least a portion of each conductive connection member being arranged at the bending region, and each conductive connection member being coupled to the first sub-pattern and the second sub-pattern.

8. The display substrate according to claim 6, further comprising:
a cathode, at least a portion of the cathode being arranged at the pixel region; and
a second power source pattern arranged at the peripheral region and coupled to the cathode, wherein the second power source pattern comprises a second straight edge portion and a second corner portion coupled to the second straight edge portion, the second straight edge portion extends in the second direction, and an angle a between an extension direction of a radius of curvature of the second corner portion and the second direction satisfies 0°≤a≤90°.

9. The display substrate according to claim 8, wherein an orthogonal projection of the first power source pattern onto a base substrate of the display substrate is located between an orthogonal projection of the pixel region onto the base substrate and an orthogonal portion of a portion of the second power source pattern onto the base substrate.

10. The display substrate according to claim 8, further comprising a first transfer pattern, wherein an orthogonal projection of the first transfer pattern onto a base substrate of the display substrate overlaps an orthogonal projection of the second power source pattern onto the base substrate at a first overlapping region, and the orthogonal projection of the first transfer pattern onto the base substrate of the display substrate overlaps an orthogonal projection of the cathode onto the base substrate at a second overlapping region, and the first transfer pattern is coupled to the second power source pattern through a via hole in the first overlapping region and coupled to the cathode through a via hole in the second overlapping region.

11. The display substrate according to claim 10, wherein the first transfer pattern surrounds the pixel region.

12. The display substrate according to claim 1, wherein each subpixel comprises a light-emitting element and a pixel driving circuit, the light-emitting element comprises a cathode, a light-emitting layer and an anode laminated one on another, the anode is arranged between the light-emitting layer and a base substrate of the display substrate, the pixel driving circuit comprises a first connection member arranged between the anode and the base substrate, a driving transistor, and a threshold compensation transistor, the first connection member extends in the first direction, a first electrode of the threshold compensation transistor is electrically coupled to a first electrode of the driving transistor, and a second electrode of the threshold compensation transistor is electrically coupled to a gate electrode of the driving transistor through the first connection member;
the first pixel block comprises a first active light-emitting region, and the second pixel block comprises a second active light-emitting region, in the first pixel block, a minimum distance between an orthogonal projection of the first connection member onto a straight line extending in the second direction and an orthogonal projection of the first active light-emitting region onto the straight line is a first distance, or the orthogonal projection of the first connection member onto the straight line extending in the second direction overlaps the orthogonal projection of the first active light-emitting region onto the straight line; in the second pixel block, a minimum distance between the orthogonal projection of the first connection member onto the straight line and an orthogonal projection of the second active light-emitting region onto the straight line is a second distance, and the first distance is smaller than the second distance; and
in the first pixel block, an overlapping area between an orthogonal projection of the anode onto the base substrate and the orthogonal projection of the first connection member onto the base substrate is a first overlapping area, in the second pixel block, an overlapping area between the orthogonal projection of the anode onto the base substrate and the orthogonal projection of the first connection member onto the base substrate is a second overlapping area, and a ratio of the first overlapping area to the second overlapping area is 0.8 to 1.2.

13. The display substrate according to claim 2, wherein each subpixel comprises a light-emitting element and a pixel driving circuit for driving the light-emitting element, the light-emitting element comprises a cathode, a light-emitting layer and an anode laminated one on another in a direction close to a base substrate of the display substrate, and the anode comprises a body electrode and a connection electrode;
the plurality of subpixels comprises a plurality of subpixels in a third color and a plurality of subpixels in a second color, each subpixel in the third color comprises a third active light-emitting region, the body electrode of the subpixel in the third color has a same shape as the third active light-emitting region, an orthogonal projection of the third active light-emitting region onto the base substrate is located within an orthogonal projection of the body electrode onto the base substrate, each subpixel in the second color comprises a fourth active light-emitting region, the body electrode of the subpixel in the second color has a same shape as the fourth active light-emitting region, and an orthogonal projection of the fourth active light-emitting region onto the base substrate is located within an orthogonal projection of the body electrode onto the base substrate;
the plurality of data lines is arranged at a side of the anode facing the base substrate, and the body electrode of at least one of the subpixel in the third color and the subpixel in the second color overlaps at least two data lines;
the display substrate further comprises:
a planarization layer arranged between a film layer where the plurality of data lines is located and a film layer where the anode is located, and
an interlayer insulation layer arranged between the film layer where the plurality of data lines is located and the base substrate of the display substrate;
each subpixel comprises a second connection member arranged at a same layer as the data line;
in the subpixel in the third color, the connection electrode is electrically coupled to the second connection member through a first via hole penetrating through the planarization layer, and the second connection member is electrically coupled to the pixel driving circuit through a first connection hole penetrating through the interlayer insulation layer; and in a direction perpendicular to the base substrate, the first via-hole and the first connection hole do not overlap the body electrode, and an orthogonal projection of the first via hole onto a first straight line extending in the first direction overlaps an orthogonal projection of the first connection hole onto the first straight line.

14. The display substrate according to claim 2, wherein each subpixel comprises a light-emitting element, the light-emitting element comprises a cathode, a light-emitting layer and an anode laminated one on another, the cathode is arranged at a side of the anode away from a base substrate of the display substrate, the plurality of subpixels comprises a plurality of subpixels in a second color, each subpixel in the second color comprises a fourth active light-emitting region,
the plurality of data lines is arranged at a side of the anode facing the base substrate of the display substrate, and each subpixel further comprises a second connection member arranged at a same layer as the plurality of data lines and coupled to the anode;

in a direction perpendicular to the base substrate, the anode of each subpixel in the second color overlaps each of the data line, the first power source line and the second connection member, and in portions of the data line, the first power source line and the second connection member overlapping the anode, the first power source line and the data line are arranged at two sides of the second connection member respectively; the second connection member comprises a first connection sub-member and a second connection sub-member coupled to the first connection sub-member and arranged at a side of the first connection sub-member close to the first power source line, and each of the first connection sub-member and the second connection sub-member overlaps the anode; and in the first direction, a size of the first connection sub-member is greater than a size of the second connection sub-member, and a ratio of a minimum distance between adjacent edges of the first connection sub-member and the data line to a minimum distance between adjacent edges of the second connection sub-member and the first power source line is 0.4 to 2.2.

15. A display device, comprising a display substrate, wherein the display substrate comprises:
    a pixel region and a peripheral region arranged at a periphery of the pixel region;
    a plurality of first power source lines, at least a portion of each first power source line being arranged at the pixel region and extending in a first direction;
    a fanout region arranged at the peripheral region, the pixel region being provided with a first side and a second side arranged in the first direction, the fanout region being arranged at the first side; and
    a plurality of subpixels arranged at the pixel region and comprising at least one pair of subpixels in a first color and a plurality of sub-pixels in the other colors,
    wherein each pair of subpixels in the first color comprise a first pixel block and a second pixel block arranged in a second direction and both emitting light in the first color, a minimum distance between the first pixel block and the second pixel block in each pair of subpixels in the first color is smaller than a minimum distance between two subpixels in a same color in the plurality of subpixels in the other colors, and an angle between the second direction and the first direction is 80° to 100°;
    wherein a length of the pixel region in the first direction is smaller than a length of the pixel region in the second direction.

16. A method for manufacturing a display substrate, wherein the display substrate comprises a pixel region and a peripheral region arranged at a periphery of the pixel region, and a length of the pixel region in a first direction is smaller than a length of the pixel region in a second direction, wherein the method comprises:
    forming a plurality of first power source lines, at least a portion of each first power source line being arranged at the pixel region and extending in the first direction;
    forming a fanout region at the peripheral region, the pixel region being provided with a first side and a second side arranged in the first direction, the fanout region being arranged at the first side;
    forming a plurality of subpixels at the pixel region, the plurality of subpixels comprising at least one pair of subpixels in a first color and a plurality of sub-pixels in the other colors, wherein each pair of subpixels in the first color comprise a first pixel block and a second pixel block arranged in the second direction and both emitting light in the first color, a minimum distance between the first pixel block and the second pixel block in each pair of subpixels in the first color is smaller than to a minimum distance between two subpixels in a same color in the plurality of subpixels in the other colors, and an angle between the second direction and the first direction is 80° to 100°.

17. The display device according to claim 15, wherein a length of the pixel region in the first direction is smaller than a length of the pixel region in the second direction, wherein the display substrate further comprises:
    a plurality of gate lines, at least a portion of each gate line being arranged at the pixel region and extending in the second direction; and
    a plurality of data lines, at least a portion of each data line being arranged at the pixel region and extending in the first direction.

18. The display device according to claim 17, wherein a length of the first power source line in the first direction is smaller than a length of the gate line in the second direction.

19. The display device according to claim 15, wherein a length D1 of the first power source line in the first direction satisfies 20% L2≤D1≤90% L2, wherein L2 represents a length of the display substrate in the second direction.

20. The display device according to claim 15, further comprising a gate driving circuit, wherein the pixel region is provided with a third side and a fourth side arranged in the second direction, and the gate driving circuit is arranged at the third side and/or the fourth side.

* * * * *